(12) United States Patent
Hahn et al.

(10) Patent No.: US 10,454,444 B2
(45) Date of Patent: Oct. 22, 2019

(54) INTEGRATED DELAY MODULES

(71) Applicant: Kumu Networks, Inc., Sunnyvale, CA (US)

(72) Inventors: Wilhelm Steffen Hahn, Sunnyvale, CA (US); Alfred Riddle, Sunnyvale, CA (US); Ernie Landi, Sunnyvale, CA (US)

(73) Assignee: Kumu Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/976,287

(22) Filed: May 10, 2018

(65) Prior Publication Data

US 2018/0262177 A1  Sep. 13, 2018

Related U.S. Application Data

(63) Continuation-in-part of application No. 15/496,948, filed on Apr. 25, 2017, now Pat. No. 9,979,374.

(Continued)

(51) Int. Cl.
*H03H 7/01* (2006.01)
*H01P 9/00* (2006.01)
(Continued)

(52) U.S. Cl.
CPC ............ *H03H 7/32* (2013.01); *H01L 23/66* (2013.01); *H01L 25/16* (2013.01); *H03H 7/0115* (2013.01); *H03H 7/1708* (2013.01); *H03H 7/1775* (2013.01); *H01L 23/481* (2013.01); *H01L 24/13* (2013.01); *H01L 24/16* (2013.01); *H01L 2224/13024* (2013.01);
(Continued)

(58) Field of Classification Search
CPC ........ H03H 7/32; H03H 25/16; H03H 23/481; H01L 2224/16265; H01L 2924/19011; H01L 2924/19041; H01L 2924/19042; H01L 2924/19102
See application file for complete search history.

(56) References Cited

U.S. PATENT DOCUMENTS 3,922,617 A  11/1975 Denniston et al.
4,321,624 A  3/1982 Gibson et al.
(Continued)

FOREIGN PATENT DOCUMENTS

EP  0755141  10/1998
EP  1959625  8/2008
(Continued)

OTHER PUBLICATIONS

Bharadia et al., "Full Duplex Radios" SIGOMM, Aug. 12-16, 2013, Hong Kong, China, Copyright 2013 ACM 978-1-4503-2056-6/6/13/08, 12 pages.
(Continued)

*Primary Examiner* — Dinh T Le
(74) *Attorney, Agent, or Firm* — Jeffrey Schox

(57) ABSTRACT

An analog time delay filter circuit including a first delay circuit block arranged in a modular layout, having a first time delay filter, a first input, a first output, and first and second pass-throughs; and a second delay circuit block arranged in the same modular layout, having a second time delay filter, a second input, a second output, and third and fourth pass-throughs.

18 Claims, 18 Drawing Sheets

Related U.S. Application Data

(60) Provisional application No. 62/327,280, filed on Apr. 25, 2016.

(51) Int. Cl.
  *H03K 5/00* (2006.01)
  *H03H 7/32* (2006.01)
  *H01L 25/16* (2006.01)
  *H01L 23/66* (2006.01)
  *H01L 23/00* (2006.01)
  *H01L 23/48* (2006.01)
  *H03H 1/00* (2006.01)

(52) U.S. Cl.
  CPC ............ *H01L 2224/13028* (2013.01); *H01L 2224/13101* (2013.01); *H01L 2224/13147* (2013.01); *H01L 2224/16265* (2013.01); *H01L 2924/19011* (2013.01); *H01L 2924/19041* (2013.01); *H01L 2924/19042* (2013.01); *H01L 2924/19102* (2013.01); *H03H 2001/0085* (2013.01)

(56) References Cited

U.S. PATENT DOCUMENTS

| | | | |
|---|---|---|---|
| 4,395,688 A | 7/1983 | Sellers | |
| 4,952,193 A | 8/1990 | Talwar | |
| 5,027,253 A | 6/1991 | Lauffer et al. | |
| 5,212,827 A | 5/1993 | Meszko et al. | |
| 5,262,740 A | 11/1993 | Willems | |
| 5,278,529 A | 1/1994 | Willems | |
| 5,691,978 A | 11/1997 | Kenworthy | |
| 5,734,305 A | 3/1998 | Ervasti | |
| 5,734,967 A | 3/1998 | Kotzin et al. | |
| 5,790,658 A | 8/1998 | Yip et al. | |
| 5,818,385 A | 10/1998 | Bartholomew | |
| 5,930,301 A | 7/1999 | Chester et al. | |
| 6,037,848 A | 3/2000 | Alila et al. | |
| 6,215,812 B1 | 4/2001 | Young et al. | |
| 6,232,836 B1 | 5/2001 | Zhou | |
| 6,240,150 B1 | 5/2001 | Darveau et al. | |
| 6,300,849 B1 | 10/2001 | Takeda | |
| 6,307,169 B1 | 10/2001 | Sun et al. | |
| 6,317,013 B1 | 11/2001 | Hershtig | |
| 6,411,250 B1 | 6/2002 | Oswald et al. | |
| 6,424,214 B2 | 7/2002 | Sera et al. | |
| 6,539,204 B1 | 3/2003 | Marsh et al. | |
| 6,567,649 B2 | 5/2003 | Souissi | |
| 6,580,771 B2 | 6/2003 | Kenney | |
| 6,583,021 B2 | 6/2003 | Song | |
| 6,612,987 B2 | 9/2003 | Morsy et al. | |
| 6,639,551 B2 | 10/2003 | Li et al. | |
| 6,657,950 B1 | 12/2003 | Jones, IV et al. | |
| 6,686,879 B2 | 2/2004 | Shattil | |
| 6,725,017 B2 | 4/2004 | Blount et al. | |
| 6,784,766 B2 | 8/2004 | Allison et al. | |
| 6,815,739 B2 | 11/2004 | Huff et al. | |
| 6,907,093 B2 | 6/2005 | Blount et al. | |
| 6,915,112 B1 | 7/2005 | Sutton et al. | |
| 6,965,284 B2 * | 11/2005 | Maekawa | H01P 1/20345 333/185 |
| 6,965,657 B1 | 11/2005 | Rezvani et al. | |
| 6,975,186 B2 | 12/2005 | Hirabayashi | |
| 6,985,705 B2 | 1/2006 | Shohara | |
| 7,057,472 B2 | 6/2006 | Fukamachi et al. | |
| 7,139,543 B2 | 11/2006 | Shah | |
| 7,177,341 B2 | 2/2007 | McCorkle | |
| 7,228,104 B2 | 6/2007 | Collins et al. | |
| 7,230,316 B2 | 6/2007 | Yamazaki et al. | |
| 7,239,219 B2 | 7/2007 | Brown et al. | |
| 7,266,358 B2 | 9/2007 | Hillstrom | |
| 7,302,024 B2 | 11/2007 | Arambepola | |
| 7,336,128 B2 | 2/2008 | Suzuki et al. | |
| 7,336,940 B2 | 2/2008 | Smithson | |
| 7,348,844 B2 | 3/2008 | Jaenecke | |
| 7,349,505 B2 | 3/2008 | Blount et al. | |
| 7,362,257 B2 | 4/2008 | Bruzzone et al. | |
| 7,372,420 B1 | 5/2008 | Osterhues et al. | |
| 7,397,843 B2 | 7/2008 | Grant et al. | |
| 7,426,242 B2 | 9/2008 | Thesling | |
| 7,468,642 B2 | 12/2008 | Bavisi et al. | |
| 7,508,898 B2 | 3/2009 | Cyr et al. | |
| 7,509,100 B2 | 3/2009 | Toncich | |
| 7,622,989 B2 | 11/2009 | Tzeng et al. | |
| 7,667,557 B2 | 2/2010 | Chen | |
| 7,706,755 B2 | 4/2010 | Muhammad et al. | |
| 7,733,813 B2 | 6/2010 | Shin et al. | |
| 7,773,759 B2 | 8/2010 | Alves et al. | |
| 7,773,950 B2 | 8/2010 | Wang et al. | |
| 7,778,611 B2 | 8/2010 | Asai et al. | |
| 7,825,751 B2 | 11/2010 | Kawaguchi et al. | |
| 7,869,527 B2 | 1/2011 | Vetter et al. | |
| 7,928,816 B2 | 4/2011 | Vangala | |
| 7,948,878 B2 | 5/2011 | Briscoe et al. | |
| 7,962,170 B2 | 6/2011 | Axness et al. | |
| 7,987,363 B2 | 7/2011 | Chauncey et al. | |
| 7,990,231 B2 | 8/2011 | Morikaku et al. | |
| 7,999,715 B2 | 8/2011 | Yamaki et al. | |
| 8,005,235 B2 | 8/2011 | Rebandt, II et al. | |
| 8,023,438 B2 | 9/2011 | Kangasmaa et al. | |
| 8,027,642 B2 | 9/2011 | Proctor, Jr. et al. | |
| 8,031,744 B2 | 10/2011 | Radunovic et al. | |
| 8,032,183 B2 | 10/2011 | Rudrapatna | |
| 8,055,235 B1 | 11/2011 | Gupta et al. | |
| 8,060,803 B2 | 11/2011 | Kim | |
| 8,081,695 B2 | 12/2011 | Chrabieh et al. | |
| 8,085,831 B2 | 12/2011 | Teague | |
| 8,086,191 B2 | 12/2011 | Fukuda et al. | |
| 8,090,320 B2 | 1/2012 | Dent et al. | |
| 8,093,963 B2 | 1/2012 | Yamashita et al. | |
| 8,155,046 B2 | 4/2012 | Jung et al. | |
| 8,155,595 B2 | 4/2012 | Sahin et al. | |
| 8,160,176 B2 | 4/2012 | Dent et al. | |
| 8,175,535 B2 | 5/2012 | Mu | |
| 8,179,990 B2 | 5/2012 | Orlik et al. | |
| 8,218,697 B2 | 7/2012 | Guess et al. | |
| 8,270,456 B2 | 9/2012 | Leach et al. | |
| 8,274,342 B2 | 9/2012 | Tsutsumi et al. | |
| 8,306,480 B2 | 11/2012 | Muhammad et al. | |
| 8,325,001 B2 | 12/2012 | Huang et al. | |
| 8,331,477 B2 | 12/2012 | Huang et al. | |
| 8,345,433 B2 | 1/2013 | White et al. | |
| 8,349,933 B2 | 1/2013 | Bhandari et al. | |
| 8,351,533 B2 | 1/2013 | Shrivastava et al. | |
| 8,378,763 B2 | 2/2013 | Wakata | |
| 8,385,855 B2 | 2/2013 | Lorg et al. | |
| 8,385,871 B2 | 2/2013 | Wyville | |
| 8,391,878 B2 | 3/2013 | Tenny | |
| 8,410,871 B2 | 4/2013 | Kim et al. | |
| 8,417,750 B2 | 4/2013 | Yan et al. | |
| 8,422,540 B1 | 4/2013 | Negus et al. | |
| 8,428,542 B2 | 4/2013 | Bornazyan | |
| 8,446,892 B2 | 5/2013 | Ji et al. | |
| 8,457,549 B2 | 6/2013 | Weng et al. | |
| 8,462,697 B2 | 6/2013 | Park et al. | |
| 8,467,757 B2 | 6/2013 | Ahn | |
| 8,485,097 B1 | 7/2013 | Nance et al. | |
| 8,498,585 B2 | 7/2013 | Vandenameele | |
| 8,502,623 B2 | 8/2013 | Lee et al. | |
| 8,502,924 B2 | 8/2013 | Liou et al. | |
| 8,509,129 B2 | 8/2013 | Deb et al. | |
| 8,521,090 B2 | 8/2013 | Kim et al. | |
| 8,547,188 B2 | 10/2013 | Plager et al. | |
| 8,576,752 B2 | 11/2013 | Sarca | |
| 8,611,401 B2 | 12/2013 | Lakkis | |
| 8,619,916 B2 | 12/2013 | Jong | |
| 8,625,686 B2 | 1/2014 | Li et al. | |
| 8,626,090 B2 | 1/2014 | Dalipi | |
| 8,649,417 B2 | 2/2014 | Baldemair et al. | |
| 8,711,943 B2 | 4/2014 | Rossato et al. | |
| 8,744,377 B2 | 6/2014 | Rimini et al. | |
| 8,750,786 B2 | 6/2014 | Larsson et al. | |
| 8,755,756 B1 | 6/2014 | Zhang et al. | |

(56) References Cited

U.S. PATENT DOCUMENTS

| | | |
|---|---|---|
| 8,767,869 B2 | 7/2014 | Rimini et al. |
| 8,787,907 B2 | 7/2014 | Jain et al. |
| 8,798,177 B2 | 8/2014 | Park et al. |
| 8,804,975 B2 | 8/2014 | Harris et al. |
| 8,837,332 B2 | 9/2014 | Khojastepour et al. |
| 8,842,584 B2 | 9/2014 | Jana et al. |
| 8,879,433 B2 | 11/2014 | Khojastepour et al. |
| 8,879,811 B2 | 11/2014 | Liu et al. |
| 8,913,528 B2 | 12/2014 | Cheng et al. |
| 8,929,550 B2 | 1/2015 | Shattil et al. |
| 8,995,410 B2 | 3/2015 | Balan et al. |
| 9,014,069 B2 | 4/2015 | Patil et al. |
| 9,019,849 B2 | 4/2015 | Hui et al. |
| 9,031,567 B2 | 5/2015 | Haub |
| 9,042,838 B2 | 5/2015 | Braithwaite |
| 9,054,795 B2 | 6/2015 | Choi et al. |
| 9,065,519 B2 | 6/2015 | Cyzs et al. |
| 9,077,421 B1 | 7/2015 | Mehlman et al. |
| 9,112,476 B2 | 8/2015 | Basaran et al. |
| 9,124,475 B2 | 9/2015 | Li et al. |
| 9,130,747 B2 | 9/2015 | Zinser et al. |
| 9,136,883 B1 | 9/2015 | Moher et al. |
| 9,160,430 B2 | 10/2015 | Maltsev et al. |
| 9,184,902 B2 | 11/2015 | Khojastepour et al. |
| 9,185,711 B2 | 11/2015 | Lin et al. |
| 9,231,647 B2 | 1/2016 | Polydoros et al. |
| 9,231,712 B2 | 1/2016 | Hahn et al. |
| 9,236,996 B2 | 1/2016 | Khandani |
| 9,264,024 B2 | 2/2016 | Shin et al. |
| 9,312,895 B1 | 4/2016 | Gupta et al. |
| 9,325,432 B2 | 4/2016 | Hong et al. |
| 9,331,737 B2 | 5/2016 | Hong et al. |
| 9,413,500 B2 | 8/2016 | Chincholi et al. |
| 9,413,516 B2 | 8/2016 | Khandani |
| 9,461,698 B2 | 10/2016 | Moffatt et al. |
| 9,490,963 B2 | 11/2016 | Choi et al. |
| 9,537,543 B2 | 1/2017 | Choi |
| 9,979,374 B2 * | 5/2018 | Hahn .................. H03H 7/32 |
| 2002/0154717 A1 | 10/2002 | Shima et al. |
| 2003/0022395 A1 | 1/2003 | Olds |
| 2003/0105399 A1 | 6/2003 | Morsy et al. |
| 2003/0148748 A1 | 8/2003 | Shah |
| 2003/0222732 A1 | 12/2003 | Matthaei |
| 2004/0106381 A1 | 6/2004 | Tiller |
| 2004/0140862 A1 | 7/2004 | Brown et al. |
| 2004/0266378 A1 | 12/2004 | Fukamachi et al. |
| 2005/0017824 A1 | 1/2005 | Hirabayashi |
| 2005/0030888 A1 | 2/2005 | Thesling |
| 2005/0051870 A1 | 3/2005 | Yamazaki et al. |
| 2005/0078743 A1 | 4/2005 | Shohara |
| 2005/0101267 A1 | 5/2005 | Smithson |
| 2005/0129152 A1 | 6/2005 | Hillstrom |
| 2005/0159128 A1 | 7/2005 | Collins et al. |
| 2005/0190870 A1 | 9/2005 | Blount et al. |
| 2005/0250466 A1 | 11/2005 | Varma et al. |
| 2005/0254555 A1 | 11/2005 | Teague |
| 2005/0282500 A1 | 12/2005 | Wang et al. |
| 2006/0017152 A1 | 1/2006 | White et al. |
| 2006/0029124 A1 | 2/2006 | Grant et al. |
| 2006/0030277 A1 | 2/2006 | Cyr et al. |
| 2006/0058022 A1 | 3/2006 | Webster et al. |
| 2006/0083297 A1 | 4/2006 | Yan et al. |
| 2006/0209754 A1 | 9/2006 | Ji et al. |
| 2006/0240769 A1 | 10/2006 | Proctor et al. |
| 2006/0273853 A1 | 12/2006 | Suzuki et al. |
| 2007/0018722 A1 | 1/2007 | Jaenecke |
| 2007/0105509 A1 | 5/2007 | Muhammad et al. |
| 2007/0126529 A1 | 6/2007 | Chen |
| 2007/0207747 A1 | 9/2007 | Johnson et al. |
| 2007/0207748 A1 | 9/2007 | Toncich |
| 2007/0249314 A1 | 10/2007 | Sanders et al. |
| 2007/0274372 A1 | 11/2007 | Asai et al. |
| 2007/0283220 A1 | 12/2007 | Kim |
| 2007/0296625 A1 | 12/2007 | Bruzzone et al. |
| 2008/0037801 A1 | 2/2008 | Alves et al. |
| 2008/0055181 A1 | 3/2008 | Kawaguchi et al. |
| 2008/0089397 A1 | 4/2008 | Vetter et al. |
| 2008/0107046 A1 | 5/2008 | Kangasmaa et al. |
| 2008/0111754 A1 | 5/2008 | Osterhues et al. |
| 2008/0131133 A1 | 6/2008 | Blunt et al. |
| 2008/0136560 A1 | 6/2008 | Bavisi et al. |
| 2008/0144852 A1 | 6/2008 | Rebandt et al. |
| 2008/0192636 A1 | 8/2008 | Briscoe et al. |
| 2008/0204165 A1 | 8/2008 | Vangala |
| 2008/0219339 A1 | 9/2008 | Chrabieh et al. |
| 2008/0219377 A1 | 9/2008 | Nisbet |
| 2008/0272875 A1 | 11/2008 | Huang et al. |
| 2008/0279122 A1 | 11/2008 | Fukuda et al. |
| 2009/0021307 A1 | 1/2009 | Tzeng et al. |
| 2009/0022089 A1 | 1/2009 | Rudrapatna |
| 2009/0034437 A1 | 2/2009 | Shin et al. |
| 2009/0047914 A1 | 2/2009 | Axness et al. |
| 2009/0051465 A1 | 2/2009 | Morikaku et al. |
| 2009/0115555 A1 | 5/2009 | Kim et al. |
| 2009/0115912 A1 | 5/2009 | Liou et al. |
| 2009/0180404 A1 | 7/2009 | Jung et al. |
| 2009/0186582 A1 | 7/2009 | Muhammad et al. |
| 2009/0213770 A1 | 8/2009 | Mu |
| 2009/0221231 A1 | 9/2009 | Murch et al. |
| 2009/0262852 A1 | 10/2009 | Orlik et al. |
| 2009/0303908 A1 | 12/2009 | Deb et al. |
| 2010/0007438 A1 | 1/2010 | Lee et al. |
| 2010/0014600 A1 | 1/2010 | Li et al. |
| 2010/0014614 A1 | 1/2010 | Leach et al. |
| 2010/0022201 A1 | 1/2010 | Vandenameele |
| 2010/0031036 A1 | 2/2010 | Chauncey et al. |
| 2010/0056166 A1 | 3/2010 | Tenny |
| 2010/0073108 A1 | 3/2010 | Yamasita et al. |
| 2010/0103900 A1 | 4/2010 | Yeh et al. |
| 2010/0117693 A1 | 5/2010 | Buer et al. |
| 2010/0136900 A1 | 6/2010 | Seki |
| 2010/0150033 A1 | 6/2010 | Zinser et al. |
| 2010/0150070 A1 | 6/2010 | Chae et al. |
| 2010/0159858 A1 | 6/2010 | Dent et al. |
| 2010/0164651 A1 * | 7/2010 | Erb .................. H01P 1/20345 333/204 |
| 2010/0208854 A1 | 8/2010 | Guess et al. |
| 2010/0214037 A1 | 8/2010 | Plager et al. |
| 2010/0215124 A1 | 8/2010 | Zeong et al. |
| 2010/0226356 A1 | 9/2010 | Sahin et al. |
| 2010/0226416 A1 | 9/2010 | Dent et al. |
| 2010/0226448 A1 | 9/2010 | Dent |
| 2010/0232324 A1 | 9/2010 | Radunovic et al. |
| 2010/0266057 A1 | 10/2010 | Shrivastava et al. |
| 2010/0279602 A1 | 11/2010 | Larsson et al. |
| 2010/0295716 A1 | 11/2010 | Yamaki et al. |
| 2011/0013684 A1 | 1/2011 | Semenov et al. |
| 2011/0013735 A1 | 1/2011 | Huang et al. |
| 2011/0026509 A1 | 2/2011 | Tanaka |
| 2011/0074527 A1 | 3/2011 | Wakata |
| 2011/0081880 A1 | 4/2011 | Ahn |
| 2011/0149714 A1 | 6/2011 | Rimini et al. |
| 2011/0171922 A1 | 7/2011 | Kim et al. |
| 2011/0216813 A1 | 9/2011 | Baldemair et al. |
| 2011/0222631 A1 | 9/2011 | Jong |
| 2011/0227664 A1 | 9/2011 | Wyville |
| 2011/0243202 A1 | 10/2011 | Lakkis |
| 2011/0250858 A1 | 10/2011 | Jain et al. |
| 2011/0254639 A1 | 10/2011 | Tsutsumi et al. |
| 2011/0256857 A1 | 10/2011 | Chen et al. |
| 2011/0268232 A1 | 11/2011 | Park et al. |
| 2011/0311067 A1 | 12/2011 | Harris et al. |
| 2011/0319044 A1 | 12/2011 | Bornazyan |
| 2012/0021153 A1 | 1/2012 | Bhandari et al. |
| 2012/0052892 A1 | 3/2012 | Braithwaite |
| 2012/0063369 A1 | 3/2012 | Lin et al. |
| 2012/0063373 A1 | 3/2012 | Chincholi et al. |
| 2012/0140685 A1 | 6/2012 | Lederer et al. |
| 2012/0147790 A1 | 6/2012 | Khojastepour et al. |
| 2012/0154249 A1 | 6/2012 | Khojastepour et al. |
| 2012/0155335 A1 | 6/2012 | Khojastepour et al. |
| 2012/0155336 A1 | 6/2012 | Khojastepour et al. |
| 2012/0201153 A1 | 8/2012 | Bharadia et al. |
| 2012/0201173 A1 | 8/2012 | Jain et al. |

(56) References Cited

U.S. PATENT DOCUMENTS

| | | |
|---|---|---|
| 2012/0224497 A1 | 9/2012 | Lindoff et al. |
| 2013/0005284 A1 | 1/2013 | Dalipi |
| 2013/0044791 A1 | 2/2013 | Rimini et al. |
| 2013/0089009 A1 | 4/2013 | Li et al. |
| 2013/0102254 A1 | 4/2013 | Cyzs et al. |
| 2013/0114468 A1 | 5/2013 | Hui et al. |
| 2013/0155913 A1 | 6/2013 | Sarca |
| 2013/0166259 A1 | 6/2013 | Weber et al. |
| 2013/0194984 A1 | 8/2013 | Cheng et al. |
| 2013/0207745 A1 | 8/2013 | Yun et al. |
| 2013/0215805 A1 | 8/2013 | Hong et al. |
| 2013/0225101 A1 | 8/2013 | Basaran et al. |
| 2013/0253917 A1 | 9/2013 | Schildbach |
| 2013/0259343 A1 | 10/2013 | Liu et al. |
| 2013/0286903 A1 | 10/2013 | Khojastepour et al. |
| 2013/0294523 A1 | 11/2013 | Rossato et al. |
| 2013/0301487 A1 | 11/2013 | Khandani |
| 2013/0301488 A1 | 11/2013 | Hong et al. |
| 2013/0308717 A1 | 11/2013 | Maltsev et al. |
| 2013/0315211 A1 | 11/2013 | Balan et al. |
| 2014/0011461 A1 | 1/2014 | Bakalski et al. |
| 2014/0016515 A1 | 1/2014 | Jana et al. |
| 2014/0126437 A1 | 5/2014 | Patil et al. |
| 2014/0169236 A1 | 6/2014 | Choi et al. |
| 2014/0185533 A1 | 7/2014 | Haub |
| 2014/0206300 A1 | 7/2014 | Hahn et al. |
| 2014/0219139 A1 | 8/2014 | Choi et al. |
| 2014/0219449 A1 | 8/2014 | Shattil et al. |
| 2014/0313946 A1 | 10/2014 | Azadet |
| 2014/0348018 A1 | 11/2014 | Bharadia et al. |
| 2014/0348032 A1 | 11/2014 | Hua et al. |
| 2014/0376416 A1 | 12/2014 | Choi |
| 2015/0049834 A1 | 2/2015 | Choi et al. |
| 2015/0139122 A1 | 5/2015 | Rimini et al. |
| 2015/0146765 A1 | 5/2015 | Moffatt et al. |
| 2015/0156003 A1 | 6/2015 | Khandani |
| 2015/0156004 A1 | 6/2015 | Khandani |
| 2015/0171903 A1 | 6/2015 | Mehlman et al. |
| 2015/0188646 A1 | 7/2015 | Bharadia et al. |
| 2015/0215937 A1 | 7/2015 | Khandani |
| 2015/0249444 A1 | 9/2015 | Shin et al. |
| 2015/0270865 A1 | 9/2015 | Polydoros et al. |
| 2015/0303984 A1 | 10/2015 | Braithwaite |
| 2016/0218769 A1 | 7/2016 | Chang et al. |
| 2017/0179916 A1 | 6/2017 | Hahn et al. |

FOREIGN PATENT DOCUMENTS

| | | |
|---|---|---|
| EP | 2237434 | 10/2010 |
| EP | 2267946 | 3/2014 |
| RU | 2256985 | 7/2005 |
| WO | 173250 | 11/2013 |
| WO | 185106 | 12/2013 |
| WO | 093916 | 6/2014 |

OTHER PUBLICATIONS

McMichael et al., "Optimal Tuning of Analog Self-Interference Cancellers for Full-Duple Wireless Communication", Oct. 1-5, 2012, Fiftieth Annual Allerton Conference, Illinois, USA, pp. 246-251.

\* cited by examiner (pass-throughs not shown)

INTEGRATED DELAY MODULES

CROSS-REFERENCE TO RELATED APPLICATIONS

This application is a continuation-in-part of U.S. application Ser. No. 15/496,948, filed on 25 Apr. 2017, which claims the benefit of U.S. Provisional Application Ser. No. 62/327,280, filed on 25 Apr. 2016, all of which are incorporated in their entireties by this reference.

TECHNICAL FIELD

This invention relates generally to the analog circuit field, and more specifically to new and useful integrated delay modules.

BACKGROUND

Time delay elements are used in a variety of analog circuits to cause analog signals to experience a time delay. In particular, time delay elements are important for RF transceivers, where they may be used for amplifier pre-distortion or feed-forward linearization, channel skewing and active interference cancellation techniques. Of course, such time delay elements may find use in a wide variety of applications involving analog signal transmission, processing, and/or synthesis.

Unfortunately, traditional delay elements (e.g., ceramic filters, SAW filters, coaxial cables, waveguide cavity resonator-based filters) may limit the performance of analog circuits; in particular, RF transceivers, due to one or more of the following problems: excessive size, excessive cost, excessive complexity, poor manufacturability, high loss, or high amplitude ripple or high phase ripple.

Thus, there is a need in the field of analog circuits to create new and useful integrated delay modules. This invention provides such new and useful modules.

DESCRIPTION OF THE INVENTION EMBODIMENTS

The following description of the invention embodiments of the invention is not intended to limit the invention to these invention embodiments, but rather to enable any person skilled in the art to make and use this invention.

As mentioned in the background section, traditional delay elements face a number of issues in integration with RF circuits. One solution to the issues posed by traditional delay elements is found in the LC-resonator-based time delay filters of U.S. patent application Ser. No. 15/382,335, the entirety of which is incorporated by this reference.

The systems described herein may increase performance of full-duplex transceivers (and other applicable systems) by enabling high accuracy time delays without prohibitive increases in circuit complexity and/or cost. Other applicable systems include active sensing systems (e.g., RADAR), wired communications systems, wireless communications systems, channel emulators, filter skirt or stop band enhancements, reflectometers, PIM analyzers and/or any other suitable system, including communication systems where transmit and receive bands are close in frequency, but not overlapping.

The present application is directed to integration of similar resonator-based time delay filters in a modular configuration that enables their use in a space- and cost-effective manner. Such integrated filter modules may be useful in a variety of applications, including self-interference cancellation circuits.

Figure 1:
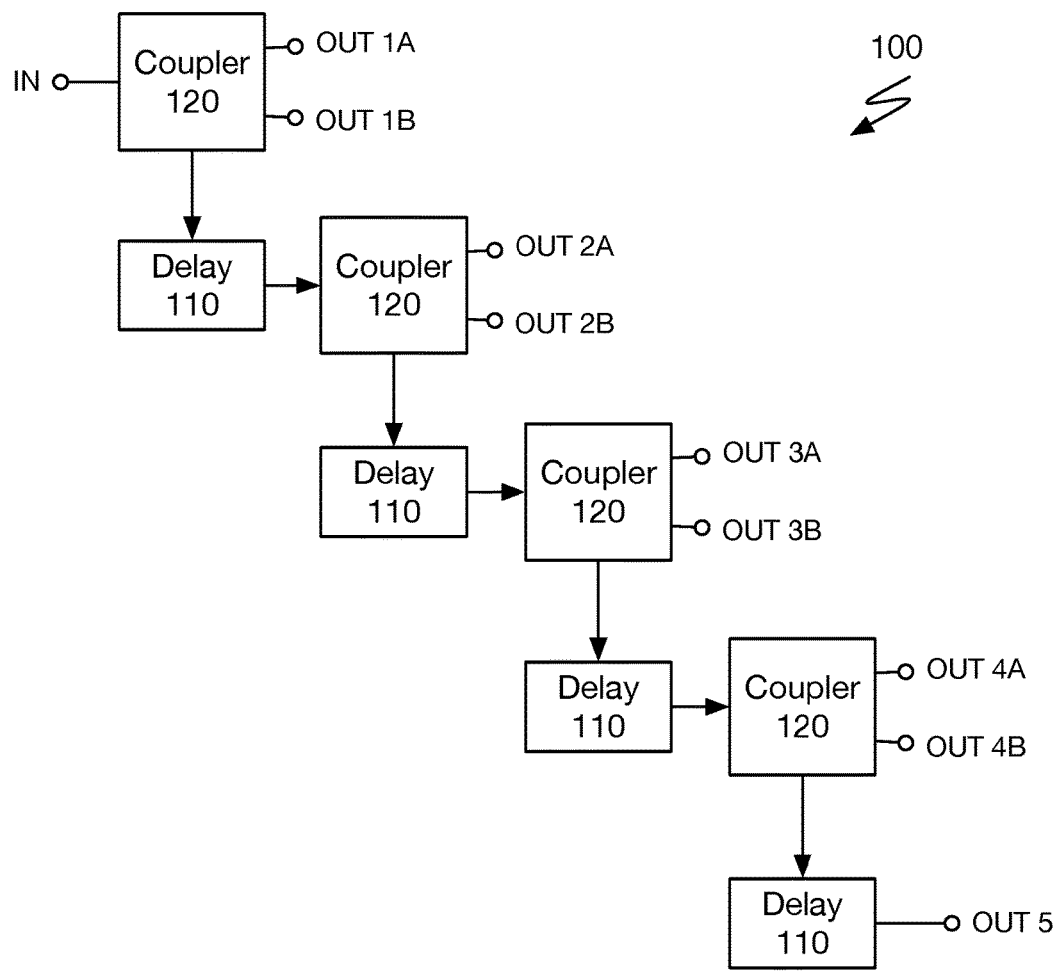
FIG. 1 is a schematic representation of an integrated delay module (IDM) of a preferred embodiment.

As shown in FIG. 1, an integrated delay module (IDM) 100 includes LC resonator delays 11o and signal couplers 120. The LC resonator 110 delays are preferably static delays that can be selectively coupled into a signal path (using the signal couplers 120) to provide a discrete-step variable delay filter. Such coupling may occur dynamically (e.g., via switches that select between integrated delay module 100 outputs) or statically (e.g., delay modules 110 may be permanently wired to achieve different delays).

The IDM 100 is preferably modular in both intra-module and inter-module senses. In other words, the IDM 100 is preferably capable of achieving discretely variable time delays internally through access of various outputs. Likewise, multiple IDMs 100 may be daisy-chained to achieve even more delay options than a single IDM 100 can provide.

1. IDM Components

Each LC resonator delay 110 preferably includes a plurality of LC resonators 111. LC resonator delays 110 may additionally or alternatively include intra-filter coupling elements 112 and/or input matching elements 113.

The LC resonator delay 110 may additionally or alternatively include any number of LC resonators 111 (e.g., the set of LC resonators 111 may contain only a single LC resonator). The LC resonator delay 110 may additionally or alternatively include any suitable components coupled to the LC resonator(s) 111 that aid or otherwise contribute to the production of a time delay, such as passive or active components (e.g., capacitors, transistors, switches, etc.), integrated components (e.g., conductive layers and/or traces), or any other suitable components.

The LC resonator delay 110 preferably functions to produce a substantially frequency-invariant group delay for analog signals within a particular frequency band of interest; typically a frequency band within the radio frequency (RF) band, but alternatively any suitable frequency band. A group delay of an analog signal will delay the amplitude envelope of each frequency component of the signal; a frequency-invariant group delay will apply an equal time delay to the amplitude envelope of each frequency component of the signal.

The LC resonator delay 110 can additionally or alternatively function to increase the performance of signal transceivers (or other applicable systems; e.g., phased antenna arrays) by enabling high accuracy, adjustable, and/or reconfigurable group delay of signals without prohibitive increases in circuit complexity and/or cost.

The LC resonator delay 110 preferably has a relatively low and frequency-invariant (in a frequency band of interest) insertion loss, but may alternatively have any insertion loss and any frequency variation. The magnitude of the frequency response of the LC resonator delay 110 is substantially flat over the range of frequencies of interest (e.g., over the range of radio frequencies) and has a magnitude ripple that is small relative to the signal magnitude (e.g., 10×, 100×, or 1000× smaller). Alternatively, the LC resonator delay 110 may have any suitable insertion loss, and the response of the delay 110 may vary with frequency in any manner.

The LC resonator delay 110 is preferably constructed from lumped and/or distributed inductors and capacitors that are integrated into the substrate of a laminate (e.g., a printed circuit board), of a microchip (e.g., a silicon substrate, potentially realized by an integrated passive device (IPD) process), or any other suitable circuit substrate. Integration of the LC resonator delay 110 may substantially reduce cost and size of the LC resonator delay 110 and can further enable modularity of the IDM 100.

Portions of the delay 110 may additionally or alternatively be added to the substrate as discrete components. For example, the LC resonator(s) 111 of the delay 110 may be integrated into the substrate, and input matching element(s) 113 and/or intra-filter coupling element(s) 112 may be coupled to the substrate and/or the LC resonators as discrete components (e.g., via wire bonding, surface mounting, etc.).

The delay 110 is preferably implemented using analog circuitry, but additionally or alternatively may be implemented by digital circuitry or any combination of analog and digital circuitry. Analog circuitry is preferably implemented using a combination of the circuit substrate and metallized/conductive layers as described above, but can additionally or alternatively be implemented using analog integrated circuits (ICs) and/or discrete components (e.g., capacitors, inductors, resistors, transistors), wires, transmission lines, transformers, couplers, hybrids, waveguides, digital components, mixed-signal components, or any other suitable components. Digital circuitry is preferably implemented using a general-purpose processor, a digital signal processor, an application specific integrated circuit (ASIC), a field programmable gate array (FPGA) and/or any suitable processor(s) or circuit(s). The delay 110 is preferably preconfigured structurally to provide a given time delay or set of time delays, but may additionally or alternatively include memory to store configuration data, or be configured using externally stored configuration data or in any suitable manner.

The LC resonator delay 110 may include multiple coupling points (i.e., points at which other circuits may couple to the LC resonator delay 110) to enable either or both of variable impedance of the LC resonator delay 110 and variable delay of the LC resonator delay 110 (as discussed in subsequent sections). Coupling may be resistive (e.g., by a wire, metallized layer, or any other suitable conductive material), capacitive (e.g., by a discrete capacitor, mutual capacitance, etc.), inductive (e.g., by a discrete inductor, mutual inductance, etc.), electromagnetic (e.g., radiative coupling), or any other suitable manner. Additionally or alternatively, LC resonators 111 may be coupled to in any suitable manner.

The LC resonator delay 110 may also alter impedance or delay of the time LC resonator delay 110 through use of tunable elements in the LC resonators 111 or matching elements 113; i.e., as opposed to modifying impedance by coupling at a different coupling point, impedance may be modified using variable capacitors and/or inductors.

Figure 2:
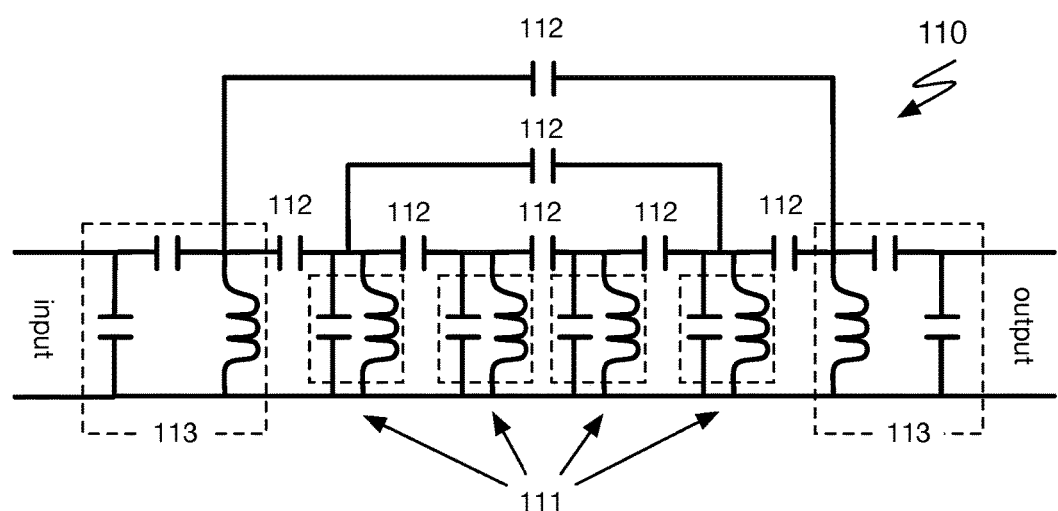
FIG. 2 is a circuit representation of an LC resonator delay of an IDM of a preferred embodiment.

Each LC resonator 111 of the delay 110 functions to contribute a time delay to an input signal of the LC resonator delay 11o. As shown in FIG. 2, LC resonators 111 are preferably coupled in parallel; alternatively, LC resonators 111 may be coupled in any manner (e.g., series, combination of parallel and series, etc.). In such an implementation, the total delay experienced by a signal passing through the delay 110 may be adjustable by selecting the number of LC resonators 111 switched into the signal path. Alternatively, the delay 11o may have a number of LC resonators 111 with different frequency responses that may produce different time delays, and in such cases the delay of the time delay filter is preferably approximately equal to the sum of the time delay of each LC resonator 111 in the signal path.

Each LC resonator 111 of the delay 110 preferably has substantially the same frequency response and produces a substantially similar time delay. Accordingly, the delay of the LC resonator delay 11o is preferably approximately equal to the number of LC resonators 111 multiplied by the average time delay of the LC resonators 111. Alternatively, each LC resonator 111 may have any impedance and/or any time delay, and the LC resonator delay 11o may have any input/output impedance and total time delay.

Each LC resonator 111 preferably includes a substantially capacitive element (i.e., an element whose reactance, in a frequency band of interest, is negative) and a substantially inductive element (i.e., an element whose reactance, in a frequency band of interest, is positive) placed in parallel. Alternatively, each LC resonator 111 may include any circuit elements such that the impedance of the resonator 111 is approximately characterized by:

$$Z(\omega) = -jk\frac{\omega}{\omega^2 - \omega_0^2}$$

where k is a constant $$\left(\text{in a pure } LC \text{ circuit, } k = \frac{1}{c}\right)$$

and $\omega_0$ is the resonant frequency of the resonator $$\left(\text{in a pure } LC \text{ circuit, } \omega_0 = \frac{1}{\sqrt{LC}}\right).$$

Alternatively, the LC resonator may include circuit elements that are networked together to provide any suitable total impedance that varies as a function of frequency in any suitable manner.

The LC resonator 111 is preferably constructed in a laminate or chip substrate of the IDM 100 from a combination of metallization layer strips (e.g., strip inductor, microstrips, etc.), vias (e.g., through-hole vias, partial vias, buried vias, metallized slots, etc.), and the substrate itself. Additionally, the LC resonator 111 may include high-k dielectric layers. Alternatively, the LC resonator 111 may be constructed using any suitable materials.

The LC resonator 111 is preferably constructed from a combination of a parallel plate capacitor and a strip inductor on a laminate substrate. Such a parallel plate capacitor preferably includes a first conductive planar region separated from a second conductive planar region by a dielectric material, and the first and second conductive planar regions are preferably substantially parallel (e.g., as uniformly parallel as manufacturing tolerances may permit); however, a parallel plate capacitor may additionally or alternatively include any suitable subcomponents configured in any suitable manner. Alternatively, the LC resonator 111 may be constructed on a semiconductor/insulator chip substrate or from any other suitable capacitive/inductive elements (e.g., a spiral inductor or interdigitated finger capacitor). For example, an LC resonator 111 may include a braided inductive element (i.e., an inductive element comprising several inductive sub-elements in parallel, separated by an insulator, 'braided' or otherwise positioned near each other). Such a braided inductive element is preferably formed from layers of the substrate including regions of alternately isolative and conductive material, which, when stacked together to form the substrate, are configured into a three-dimensional braided structure. Alternatively, a braided inductive element may be formed from any suitable materials, in any suitable manner.

Figure 3:
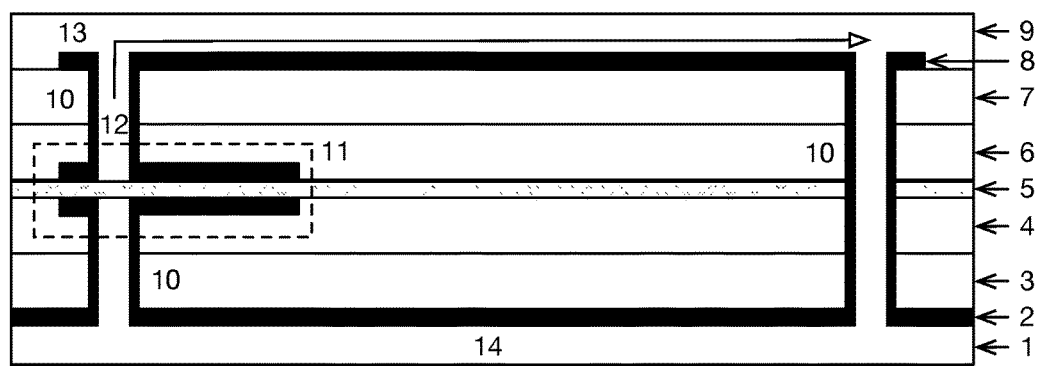
FIG. 3 is a cross-sectional example representation of a resonator of an LC resonator delay of an IDM of a preferred embodiment.

An example implementation of an LC resonator 111 is as shown in FIG. 3 (cross-sectional view). In this implementation, the LC resonator 111 is constructed on a laminate substrate, having a number of isolative layers (1, 3-7, 9) and conductive layers (2, 8). The LC resonator 111 is formed from a parallel plate capacitor 11, of which a first plate is coupled to a ground plane 14 by a conductive via 10, and a strip inductor 12, which is coupled to the second plate of the capacitor 11 by a conductive via 10 and is coupled to the ground plane 14 by another conductive via 10. The ground plane may extend over all or most of the surface of the substrate on one side, and thus extend over a greater area than the strip inductor; alternatively, the ground plane may be a second strip inductor on the opposing side of the substrate that is of substantially the same size and extent, or may alternatively extend over any other suitable area. The resonator 111 may be coupled to at coupling point 13. If constructed on a laminate substrate, the LC resonator 111 may include any number of layers made of any material. For example, in this example implementation, the resonator 111 may include epoxy prepreg layers 4 and 6; FR-4 core layers 3, 7; copper conductive layers 2, 8; and hafnium oxide high-k dielectric layer 5, with copper vias 10. The layers, vias, and elements may be of any shape, size, thickness, etc. Note that in particular the dielectric material separating the plates of the capacitor (in this case layer 5) may be a standard isolative layer (e.g., a core layer), but may alternatively be a different dielectric material (e.g., a dielectric material with higher k or otherwise suitable to serve as an insulator for the capacitor 11).

LC resonators 111 may include multiple tapping (i.e., coupling) points to enable modification of the impedance of the LC resonator 111 (as seen by coupled or matching circuits). Additionally or alternatively, resonator 111 tapping may be used to modify impedance, time delay, resonance frequency, etc.

If a component of an LC resonator 111 includes multiple tapping points, they may be coupled to in any manner. For example, a switch (e.g., a transistor) may be coupled between a resonator 111 input and multiple tapping points, enabling a selection of tapping points. As another example, a switch may be coupled between tapping points, allowing those tapping points to be shorted.

If a component of an LC resonator 111 includes multiple tapping points and a coupling point at which it is coupled to other LC resonators (e.g., resistively coupled, capacitively coupled, inductively coupled, electromagnetically coupled), they may be selectively coupled in any suitable manner. For example, a set of switches (e.g., transistors, a multi-input/single-output multiplexer, etc.) may be coupled between the tapping points (taps) and the coupling point, enabling selection and/or adjustment of the impedance of the resonator as seen by components (e.g., resonators 111, matching elements) coupled to the coupling point.

In addition to having tapping points, LC resonators 111 may integrate or be coupled to tunable circuit elements (e.g., capacitors, inductors, transistors, resistors) to change their tuning properties. Tuning of the LC resonators 111 (and hence the delay filter) may also be done permanently during or at the end of the manufacturing process by adding (e.g. the use of 3D metal printing) or removing (e.g. milling metal away) material from traces, inductor or the plate of any capacitor in the circuit. Alternatively capacitors and/or inductors may be tuned by blowing small fuses implemented as traces in the substrate, adding or removing solder bridges, or adjusting the amount of insulating material on top, underneath, or on the side of the resonators.

As previously described, LC resonators 111 of the LC resonator delay 110 are preferably coupled in parallel to form the LC resonator delay 110 (or part of the LC resonator delay 110). While LC resonators 111 may be coupled in any manner (e.g., resistively), LC resonators 111 are preferably coupled to each other capacitively (using capacitive intra-filter coupling elements 112) and/or inductively (by positioning inductors of LC resonators 111 to enable magnetic coupling between the inductors) or in any combination of the coupling methods (e.g. 50% capacitive and 50% inductive).

Intra-filter elements 112 function to couple LC resonators 111 of the LC resonator delay 110. Similarly to components of the LC resonator 111, intra-filter elements are preferably passive capacitive, resistive, and/or inductive elements, but intra-filter elements may be any combination of active or passive components capable of coupling LC resonators 111. Intra-filter elements 112 are preferably constructed from a combination of metallization layer strips, vias, and the substrate, but may additionally or alternatively be constructed in any manner.

Input matching elements 113 function to couple LC resonators 111 to an input and/or output of the LC resonator delay 110 with a desired impedance. Input matching elements 113 preferably include circuits comprising passive capacitive, resistive, and/or inductive elements, but input matching elements 113 may be any active or passive combination of components capable of coupling the LC resonator delay 110 to an external circuit. Input matching elements 113 are preferably constructed from a combination of metallization layer strips, vias, and the substrate, but may additionally or alternatively be constructed in any manner.

Figure 4:
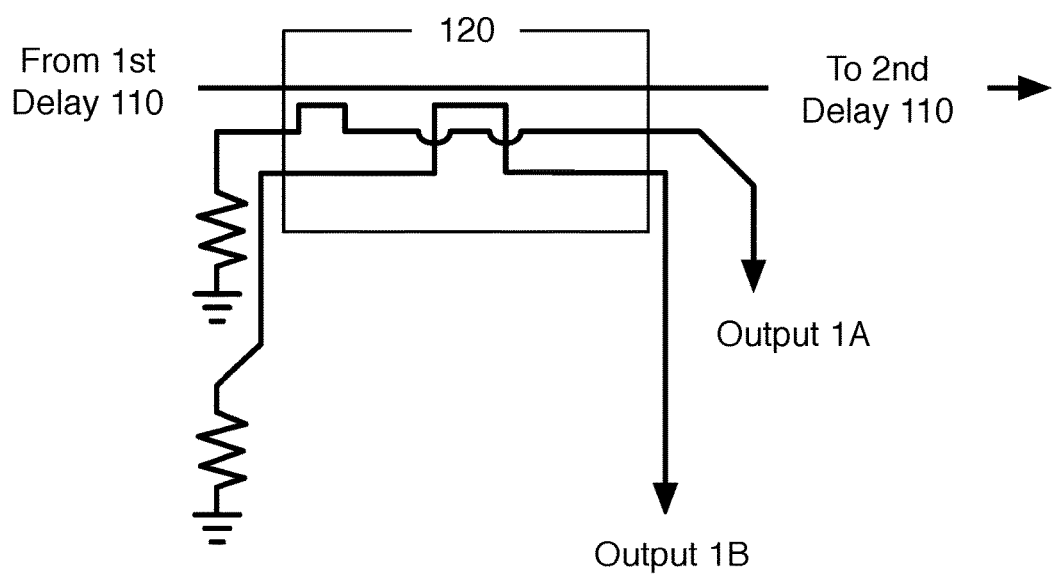
FIG. 4 is a circuit representation of a signal coupler of an IDM of a preferred embodiment.

The signal couplers 120, as shown in FIG. 4, function to couple LC resonator delays 110 of the IDM 100 (e.g., to each other, or to external signal paths). In general, the signal couplers 120 function to allow signals to be split and/or combined.

Signal couplers 120 preferably have a single input, but may additionally or alternatively have multiple inputs. Likewise, signal couplers 120 preferably have at least two outputs; a primary output (e.g., to direct a signal to another delay) and a secondary output (e.g., to enable mid-IDM 100 tapping of a signal). Additionally or alternatively, signal couplers may have multiple outputs (e.g., as shown in FIG. 4); this may be useful for MIMO circuits in which the delayed TX signal received from one transmitter is fed into different cancellers; each associated with a separate receive chain.

The signal coupler 120 may route power between inputs and outputs in any manner. For example, a signal coupler 120 may route the majority of power to a single output (of three outputs), or the signal coupler may split signals equally between the three outputs. The signal coupler 130 may have any number of input and output ports, including bidirectional input/output ports.

The signal coupler 120 is preferably a short section directional transmission line coupler, but may additionally or alternatively be any power divider, power combiner, directional coupler, or other type of signal splitter. The signal coupler 120 is preferably a passive coupler, but may additionally or alternatively be an active coupler (for instance, including amplifiers and/or switches). For example, the signal coupler 120 may comprise a coupled transmission line coupler, a branch-line coupler, a Lange coupler, a Wilkinson power divider, a hybrid coupler, a hybrid ring coupler, a multiple output divider, a waveguide directional coupler, a waveguide power coupler, a hybrid transformer coupler, a cross-connected transformer coupler, a resistive tee, and/or a resistive bridge hybrid coupler. The output ports of the signal coupler 120 are preferably not phase-shifted, but may additionally or alternatively be phase shifted by any amount (e.g., 90 degrees, 180 degrees).

In addition to the LC resonator delays 110 and the signal couplers 120, the IDM 100 may include any suitable components to connect or modify signals traveling in the IDM 100. For example, the IDM 100 may include amplifiers in between some LC resonator delays 110.

In an example implementation of a preferred embodiment, a delay 110 includes a substrate and an LC resonator 111. The substrate is a laminated circuit board that is comprised of several layers and has two broad, substantially parallel outer surfaces (e.g., a top and bottom surface, though the substrate may be in any suitable orientation). The resonator includes a capacitive element and an inductive element, coupled together into an LC circuit that is connected in parallel between a conductive contact point (e.g., a coupling point) on the first surface and a ground plane (e.g., a conductive region) on the second surface. The inductive element is a strip inductor that is formed by a conductive region (e.g., a metallized strip) on the first surface, and connected to the capacitive element and the ground plane by a pair of conductive vias. The first via is a through-hole via passing through the substrate (e.g., through several isolative and/or conductive layers of the substrate) to the ground plane, and the second via is a partial via that passes through the substrate to an intermediate position within the substrate where the capacitive element is located. There is also a third via that passes through the substrate between the capacitive element and the ground plane, and is directly electrically connected (e.g., soldered) to both. The capacitive element, which may be a parallel plate capacitor or any other suitable capacitive element, completes the LC circuit while interrupting the continuous conductive region (e.g., by way of a dielectric barrier between two sides, such as parallel plates, of the capacitive element). Together, the strip inductor, the first, second, and third vias, the capacitor, and the ground plane form a loop. This loop encloses an area that defines a normal axis, and the normal axis is substantially parallel to the plane(s) of the surfaces of the substrate; in other words, the conductive loop passes through the substrate in two locations (in this example, the locations of the vias) and lies adjacent to the substrate on two contralateral sides of the substrate.

In variations of a preferred embodiment, the LC resonators 111 may have a certain inductance and capacitance per unit length that repeats in a harmonic fashion over the length of the resonator, and the delay 110 may therefore be well-represented using a distributed inductor and capacitor model (e.g., a transmission line model). In other variations, the LC resonators 111 may be formed from localized discrete components (e.g., ceramic capacitors, on-chip capacitors, wound-wire inductors) such that the delay 110 is well-represented using a lumped-element model. In still further variations including a plurality of LC resonators, a subset of LC resonators may be represented by a distributed model and another subset of LC resonators may be represented by a lumped element model.

Note that in many cases, the positioning of resonators relative to one another and the coupling between resonators 111 (whether it be capacitive, magnetic, or both) may play into the performance of the delay 110. For example, resonators may be coupled in a large horseshoe pattern. Alternatively, resonators may be coupled in a meander pattern or a zigzag pattern. Resonators 111 may be positioned and coupled in any manner.

2. IDM Structure (Laminate)

Figure 5A:
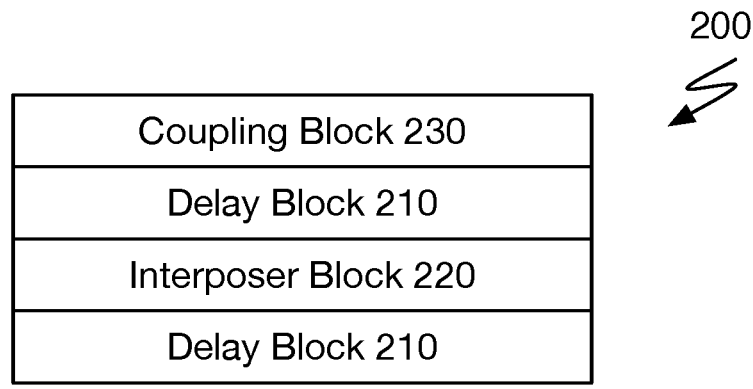
FIGS. 5A and 5B are layer representations of a structure of a preferred embodiment.
Figure 5B:
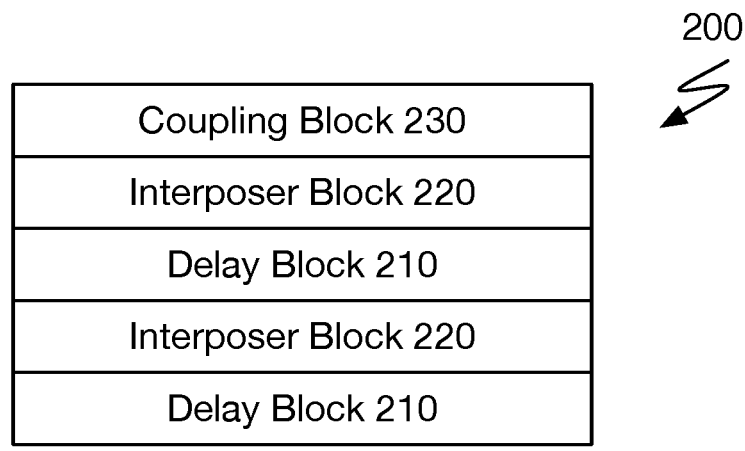

The IDM 100 is preferably implemented as part of a multi-layer laminate structure 200, as shown in FIG. 5A. The laminate structure 200 preferably comprises a set of delay blocks 210, separated by interposer blocks 220 and coupled by a coupling block 230. Alternatively, there might also be an interposer block 220 between the upper most delay block 210 and the coupling block 230, as shown in FIG. 5B. Additionally or alternatively, the structure 200 may include any number of delay blocks 210, interposer blocks 220, and coupling blocks 230 (including zero).

The structure 200 functions as a particular implementation of the IDM 100, and thus is an analog time delay filter circuit.

Each block of the laminate structure 200 preferably includes multiple layers; additionally or alternatively, the laminate structure 200 may include single-layer blocks. Note that the term 'block' as used throughout this application refers to a three-dimensional volume containing at least one circuit element (e.g., an inductive, capacitive, and/or resistive element). A block may represent the entirety of one or more layers or any sub-area or sub-volume of those layers. While blocks are generally shown in the FIGUREs of this specification as rectangular prisms, it is understood that they may be of any shape.

The term 'block' is used due to the modular capability of the structure 200; blocks may be repeated (e.g., across a single layer or in different layers) to create such a modular structure. A 'repeated' block is a block with an identical modular layout to another block (i.e., external connections are accessible at the same points relative to a coordinate system defined by the boundaries of the block). Using an identical modular layout across layers may mean, for instance, that the same photolithographic mask can be used for more than one layer. As another example, modular chips may be assembled (e.g., by a manufacturing robot) and electrically coupled (e.g., via soldering). As a third example, blocks may include physical connectors (e.g., pins/sockets), allowing modular structures to be assembled manually. Note that while two blocks may have an identical layout, those blocks may or may not have identical electrical characteristics. For example, one block may have identical layout to another block, but use a different material for the dielectric between plates of a parallel plate capacitor (changing response).

Components and connections of the laminate structure 200 are preferably constructed using selective etching of metallization layers of the laminate structure 200 and via filling, where metallization layers of the structure 200 are preferably separated by isolative layers and incident on a laminate substrate. Additionally or alternatively, components and connections of the laminate structure 200 may be fabricated in any manner (e.g., some components of the structure 200 may be contained on an integrated passive device (IPD) chip wire bonded or flip chip mounted to the laminate structure 200).

Preferably, the structure 200 is fabricated such that, with the interposers 220, all connections of the delay blocks 210 are electrically available to the coupling block 230. Alternatively, the structure 200 may be fabricated or configured in any manner.

Figure 6:
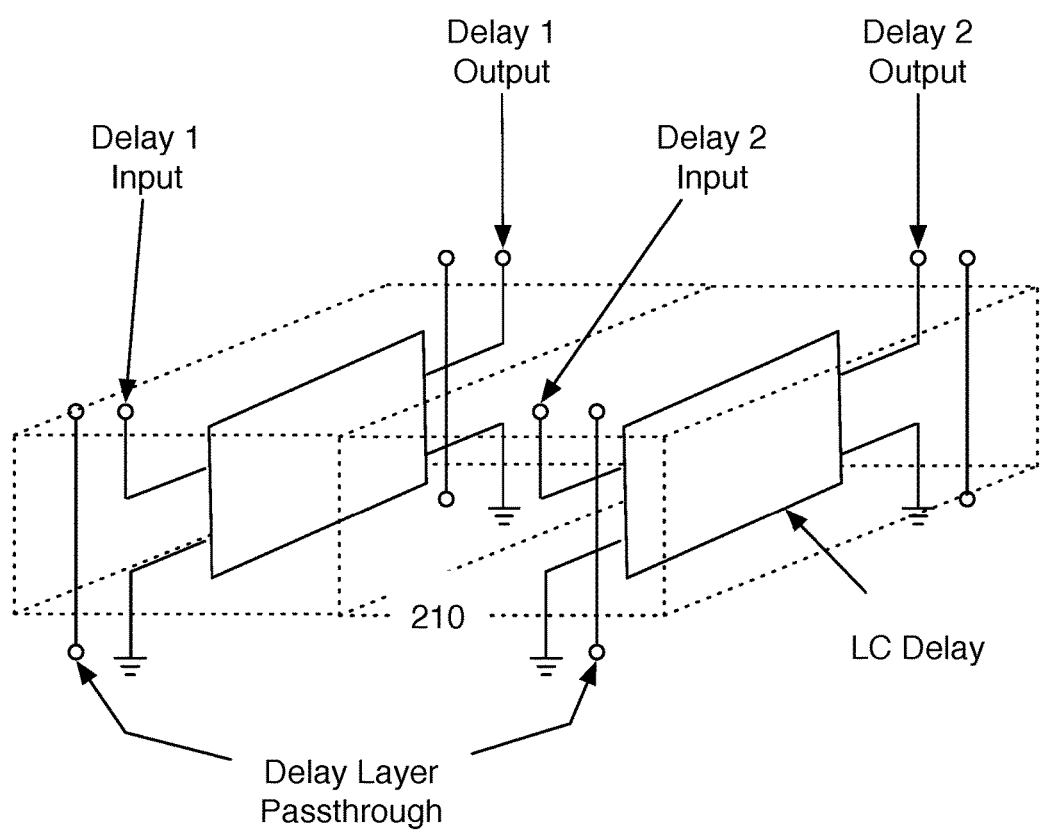
FIG. 6 is an isometric representation of a delay block of a structure of a preferred embodiment.

The delay block 210 includes one or more time delays, as shown in FIG. 6. The delay block 210 is preferably fabricated to include pass-throughs (e.g., connections on the bottom layer of the block that are passed through to the top layer of the block), so that one configuration of the delay block 210 may be reused to generate multi-delay-layer structures 200 (further discussed in the section regarding interposer layers 220). Additionally or alternatively, the delay block 210 may include no such pass-throughs.

A pass-through is a connection that does not include any intentional reactive circuit elements (noting, of course, that any real-world physical connection has non-zero reactance). Such a pass-through preferably has substantially lower reactance (e.g., 10% or less) than an LC resonator used with said pass-through.

The time delays of the delay block 210 are preferably the LC resonator delay module 110, but may additionally or alternatively be any suitable time delay circuits.

Figure 7:
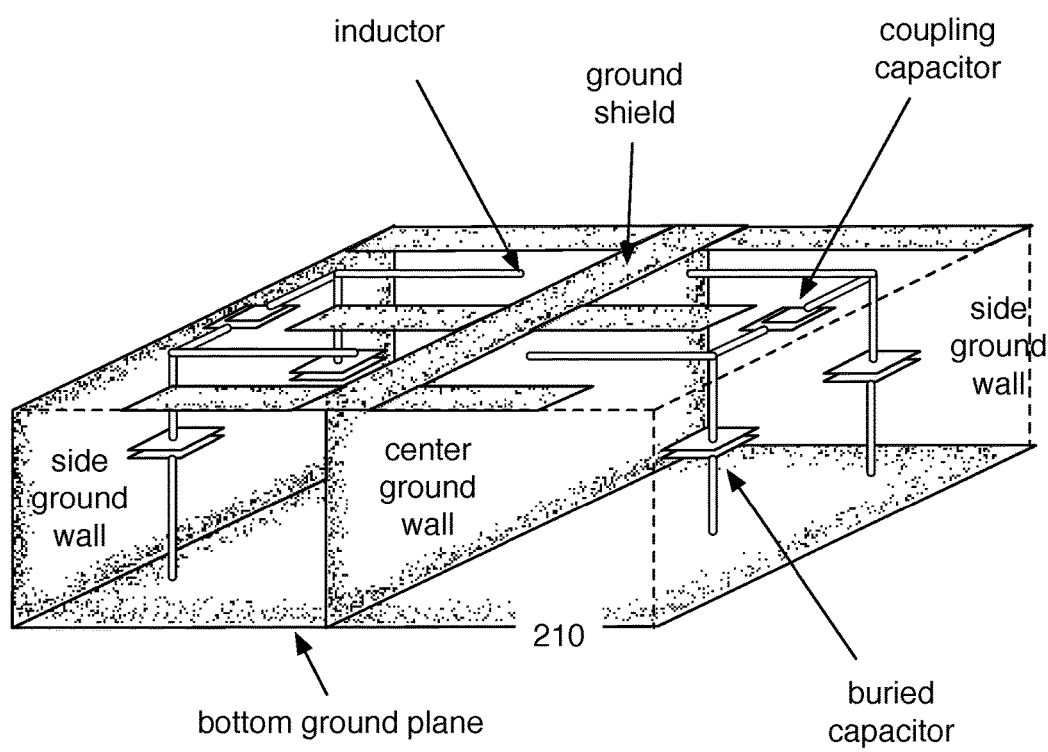
FIG. 7 is an isometric representation of components of a delay block of a structure of a preferred embodiment.

In one implementation of a preferred embodiment, each delay block 210 includes two LC delay circuits, as shown in FIG. 7. In this implementation, the delay block 210 preferably includes a bottom ground-plane layer and three vertical ground walls-two on opposing sides of the delay block 210, and one between the two LC delay circuits (referred to as the center wall). Additionally or alternatively, the delay block 210 may include any suitable vertical grounding mechanism, or may include no such vertical grounding mechanism. Note that other blocks (e.g., the interposer circuit block 220, the coupling block 230, etc.) may also share ground walls or vertical grounding mechanisms with each other and/or with delay blocks 210.

The vertical ground walls function to couple the bottom ground-plane layer of the delay block 210 to bottom ground-plane layers of delay blocks 210 that may be stacked above it. The vertical ground walls may additionally or alternatively function to provide more convenient ground paths for delay components than may be available between said components and the bottom ground-plane layer. Further, the center ground wall may further function to isolate LC delay circuits of the delay block 210; for example, the center ground wall may be coupled to a ground shield that not only electrically and/or magnetically isolates a first LC delay circuit from a second LC delay circuit, but may additionally or alternatively electrically and/or magnetically isolate components of an LC delay circuit from other components of that same circuit (e.g., it may not be desired to have inductive coupling between the inductors as shown in FIG. 7).

The ground walls on the sidewalls of the laminate structure 200 are preferably metallized sidewalls of the delay block 210, but may additionally or alternatively be vias through the delay block 210, or any other conductive structure capable of coupling the bottom ground-plane layer of the delay block 210 to a bottom ground-plane layer of another delay block 210 (e.g., via an interposer block 220).

The center ground wall is preferably a set of vias (e.g., arranged in a single or double line, or as slots, separating two delays of the delay block 210) coupling the bottom ground-plane layer of the delay block 210 to a ground shield, but may additionally or alternatively be any other conductive structure capable of coupling the bottom ground-plane layer of the delay block 210 to a bottom ground-plane layer of another delay block 210 (e.g., via an interposer block 220).

In a variation of a preferred embodiment, some components of LC delays may be external to the delay block 210. For example, an LC delay may include one or more variable capacitors; in this example, the variable capacitors may be contained within an IPD die bonded or otherwise coupled to the structure 200.

Additionally or alternatively, IPD dies (or any other attached die, chip, or discrete component) may be used to add or integrate any of the components of the structure 200.

Figure 8:
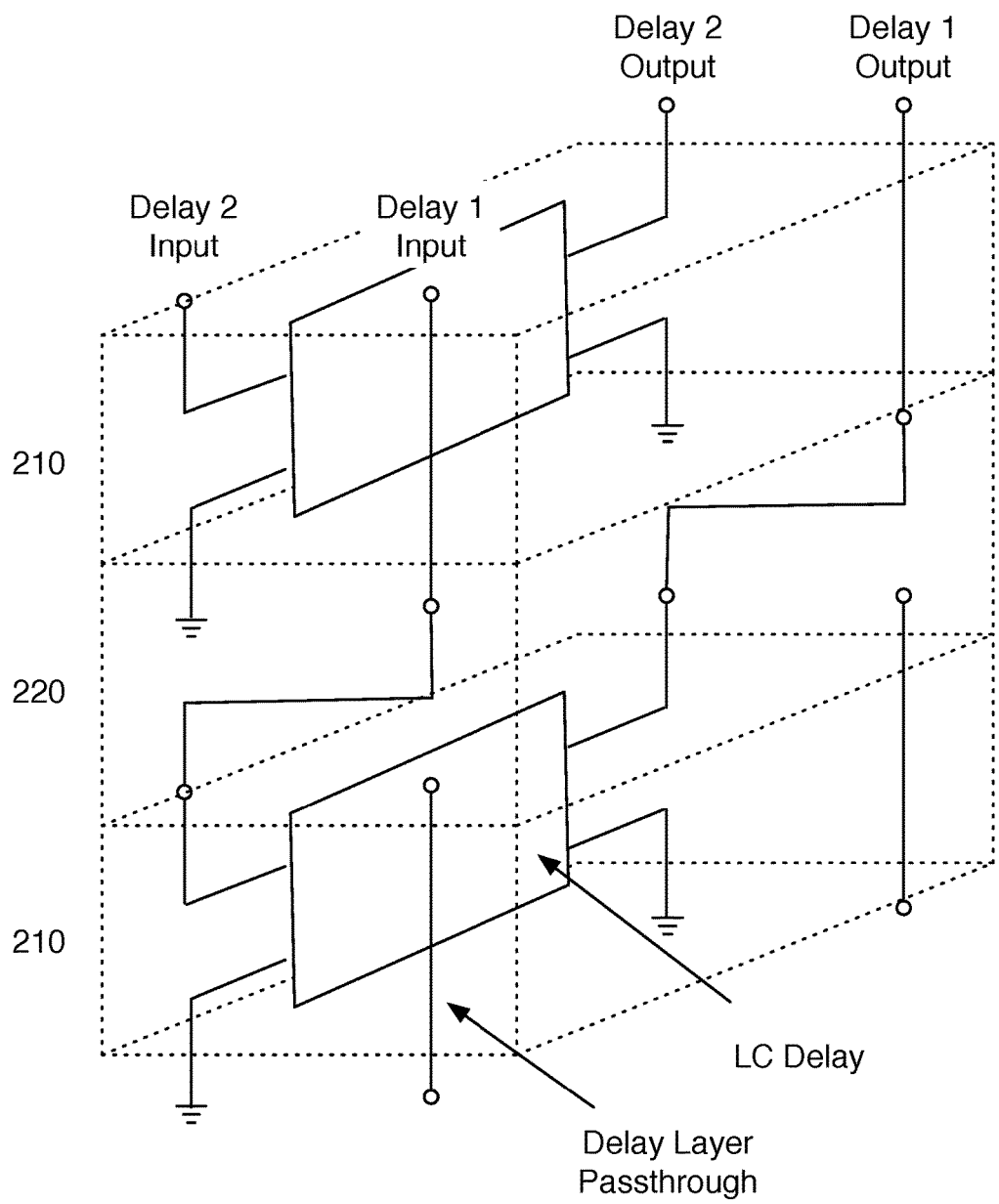
FIG. 8 is an isometric representation of a interposer block of a structure of a preferred embodiment.

The interposer block 220 preferably functions to route connections of the delay block 210 so that delay blocks 210 having identical pinouts may be stacked on top of each other, resulting in a multiple-delay structure 200, as shown in FIG. 8. Additionally or alternatively, the interposer block 220 may route connections between delay blocks 210 (or any other blocks or layers of the structure 200) in any manner.

In a structure 200 including a lower delay block 210 and an upper delay block 210, the interposer 220 preferably remaps the input and output of the lower delay block 210 to pass-throughs of the upper delay block 210 (or vice versa).

The interposer block 220 preferably comprises hard-wired conductive coupling between delay blocks 210 above and below (or otherwise sandwiching the interposer block 220). The interposer block 220 may additionally or alternatively integrate any other components of the structure 200 (e.g., signal couplers, amplifiers, passive components, etc.).

Figure 9:
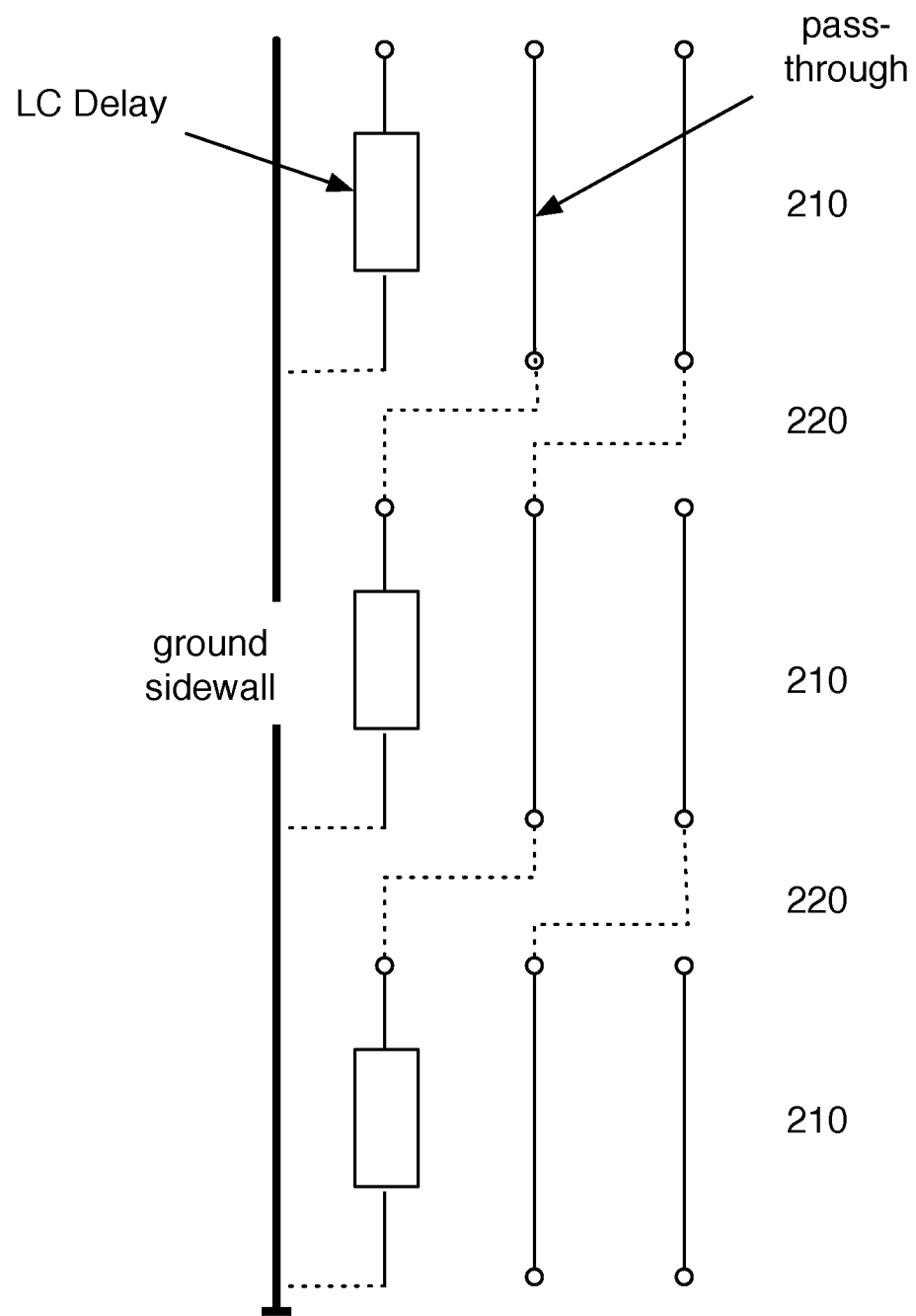
FIG. 9 is a front view representation of a interposer block of a structure of a preferred embodiment.

The interposer block 220 preferably functions to route inputs and outputs from a first delay block 210 to a second delay block 210 in a two-delay-block structure 200, but may additionally or alternatively route inputs and outputs for any number of delay blocks 210; for example, for a three-block structure 200 with each delay block 210 including two sets of pass-throughs, as shown in FIG. 9.

Figure 10A:
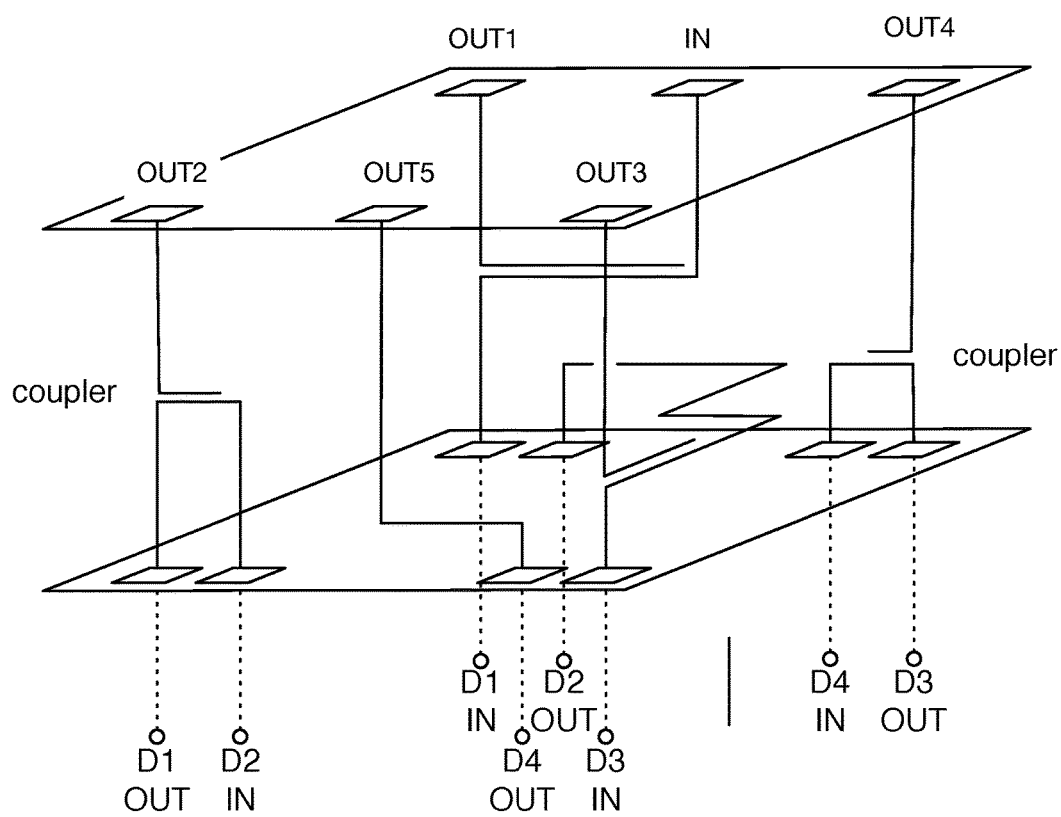
FIG. 10A is an isometric representation of a coupling block of a structure of a preferred embodiment.
Figure 10B:
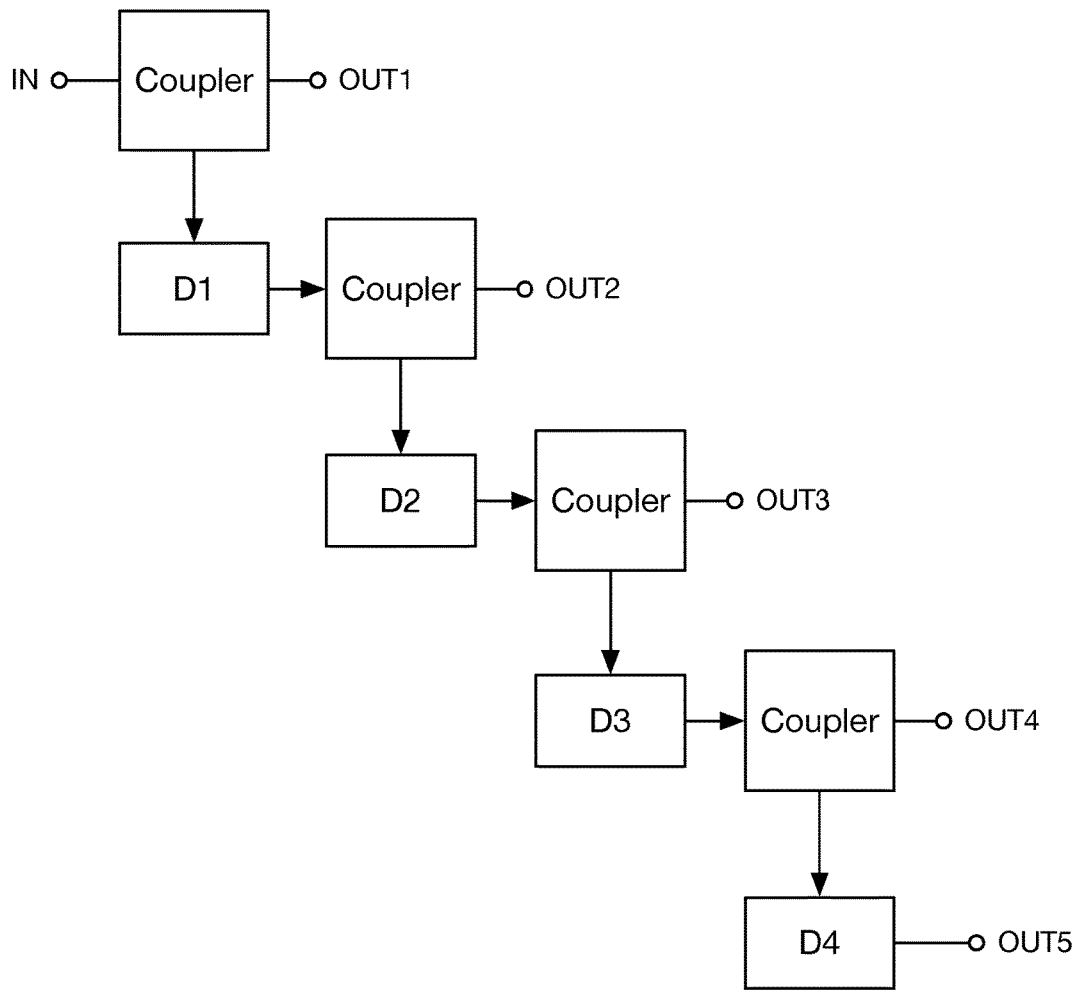
FIG. 10B is a schematic representation of a coupling block of a structure of a preferred embodiment.

The coupling block 230 includes one or more signal couplers (e.g., the signal couplers 120) and functions to provide access to delayers of the delay blocks 210, as shown in FIGS. 10A and 10B. The coupling block 230 may provide electrical access to delays in any manner (e.g., via metallic contacts arranged on a surface of the coupling block 230). The coupling block 230 may include multiple couplers, allowing the structure 200 to be coupled to at multiple points (in turn allowing the structure 200 to produce a discretely variable delay). For example, if each delay circuit is associated with a ions delay, OUT1 would result in a negligible delay, OUT2 would result in a ions delay, OUT3 in a 20 ns delay, OUT4 in a 30 ns delay, and OUT5 in an 40 ns delay.

The couplers of the coupling block 230 are preferably substantially similar to the couplers 120, but may additionally or alternatively be any suitable signal couplers.

As previously mentioned, the coupling block 230 may allow for delays of the structure 200 to be varied discretely. Such variance of delay may be accomplished in multiple manners. For example, outputs of the coupling block 230 of a first structure 200 (e.g., IN and OUT3) may be coupled (e.g., using wire bonding) to a first circuit, while outputs of the coupling block 230 of a second structure 200 (e.g., IN and OUT4) may be coupled to a second circuit (the two structures 200 having different, but static, delays).

As a second example, switches may be coupled to or integrated with the coupling block 230 (e.g., a transistor may switch between OUT4 and OUT5 as an output).

The IDM 200 may comprise any number of switches, and switches (or a set of switches) may be any suitable components capable of selectively coupling the taps and/or coupling points of delays 210, or other components to circuit common rails, grounds, and/or circuit inputs/outputs. For example, switches may include mechanical switches, mechanical relays, solid-state relays, transistors, silicon controlled rectifiers, triacs, and/or digital switches. Switches of the set of switches may be operable electronically by a tuning circuit or other suitable controller, but may additionally or alternatively be set in any manner. For example, switches may be manually set by a circuit user. As another example, switches may be one-time-use junctions that are configured into a desired configuration when the delay 210 is manufactured (e.g., by soldering, annealing, fusing, cutting or any other suitable manner of irreversible configuration), resulting in a desired overall delay 210 configuration (e.g., group delay value).

Switches are preferably operable between one or more switch states, in which a state of the switch corresponds to coupling between two or more system components. For example, a switch (e.g., transistor) may be operable in a first switch state that couples a first tapping point to a coupling point of a resonator, and in a second switch state that couples a second tapping point to a coupling point of a resonator. In another example, a switch may be operable in a first switch state that couples one of a set of resonators to a common rail (e.g., a ground plane) of the system, in order to place it in the signal path of a signal passing through the time delay filter; this switch may be operable in a second switch state that decouples the resonator from the common rail, thereby removing the resonator from the signal path (and reducing the overall time delay applied by the time delay filter).

Figure 11A:
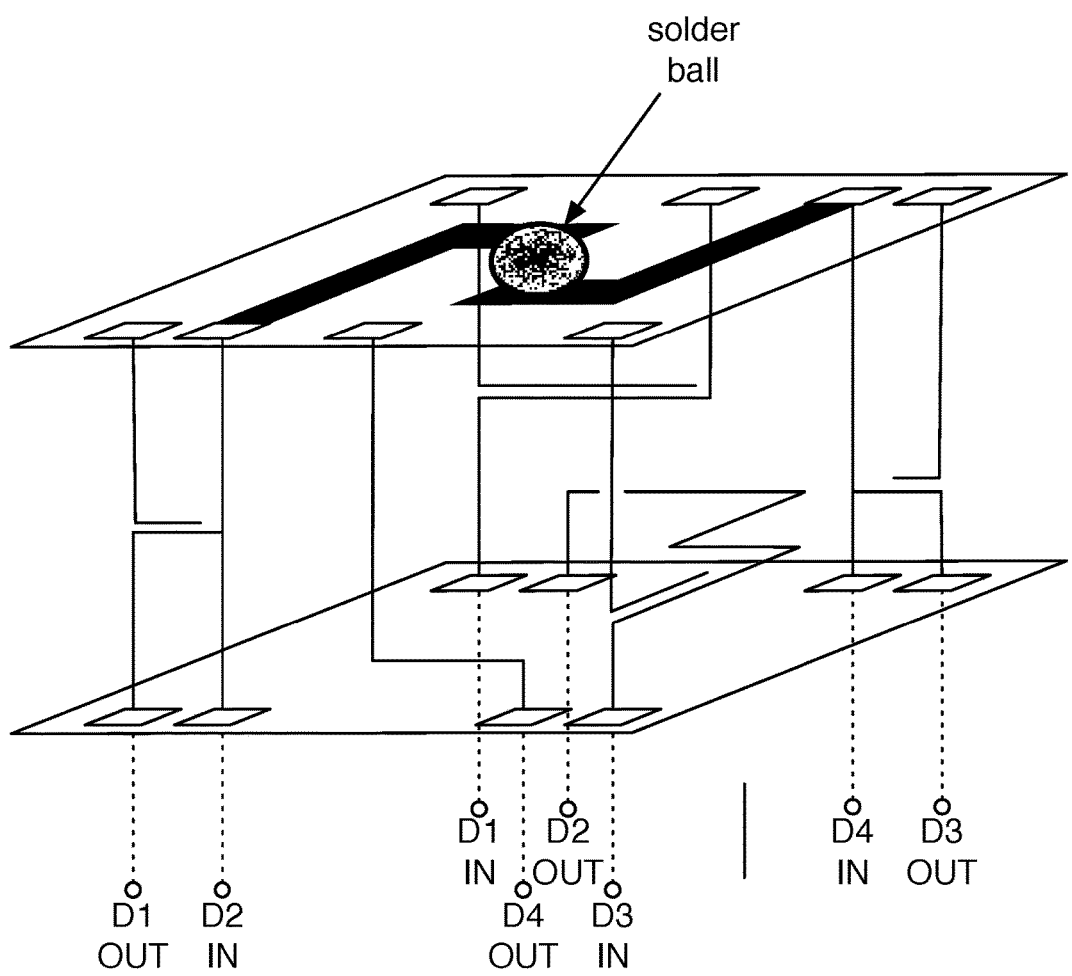
FIG. 11A is an isometric representation of a coupling block of a structure of a preferred embodiment.
Figure 11B:
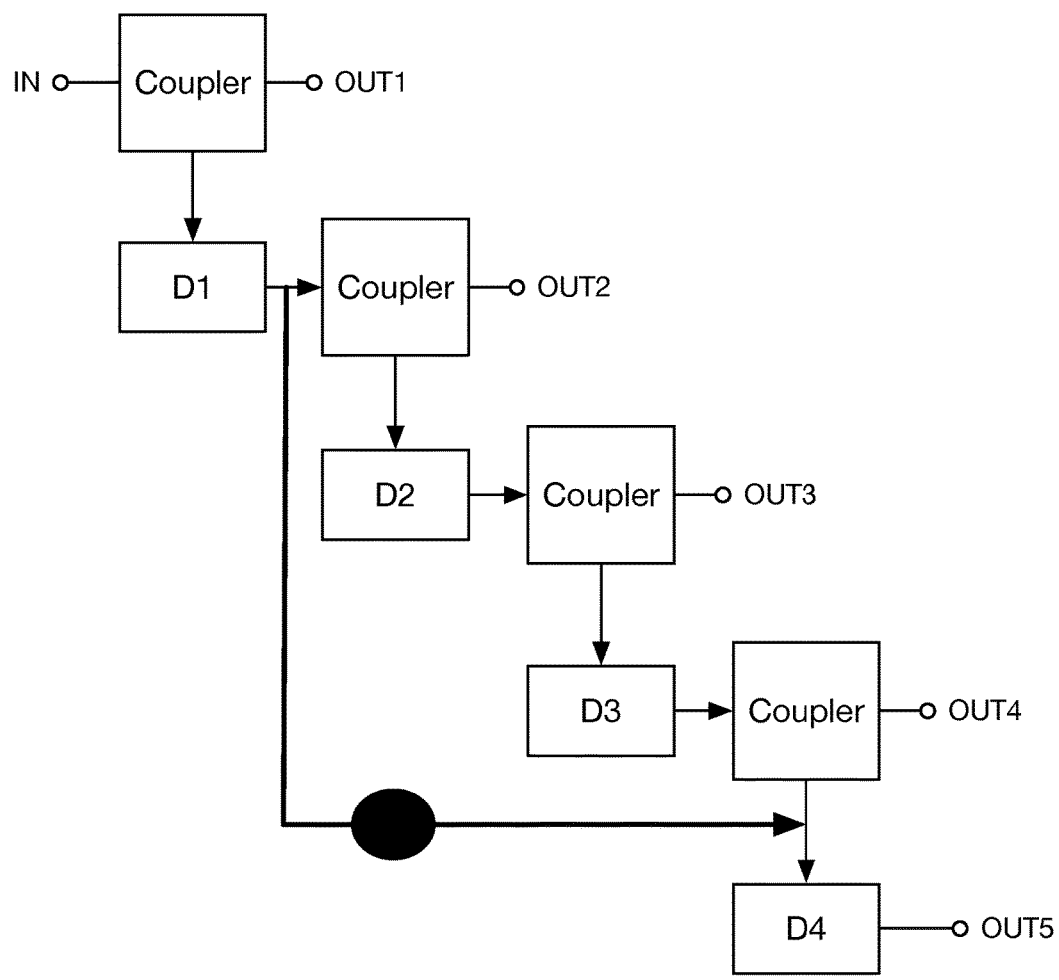
FIG. 11B is a schematic representation of a coupling block of a structure of a preferred embodiment.
Figure 12A:
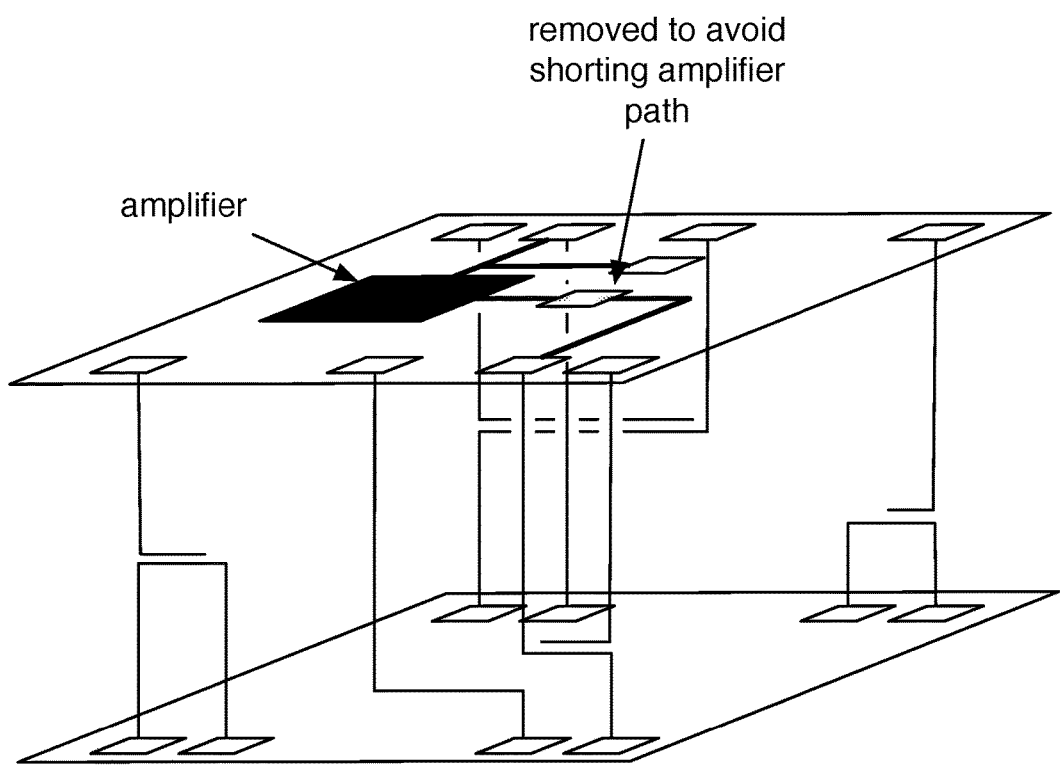
FIG. 12A is an isometric representation of a coupling block of a structure of a preferred embodiment.
Figure 12B:
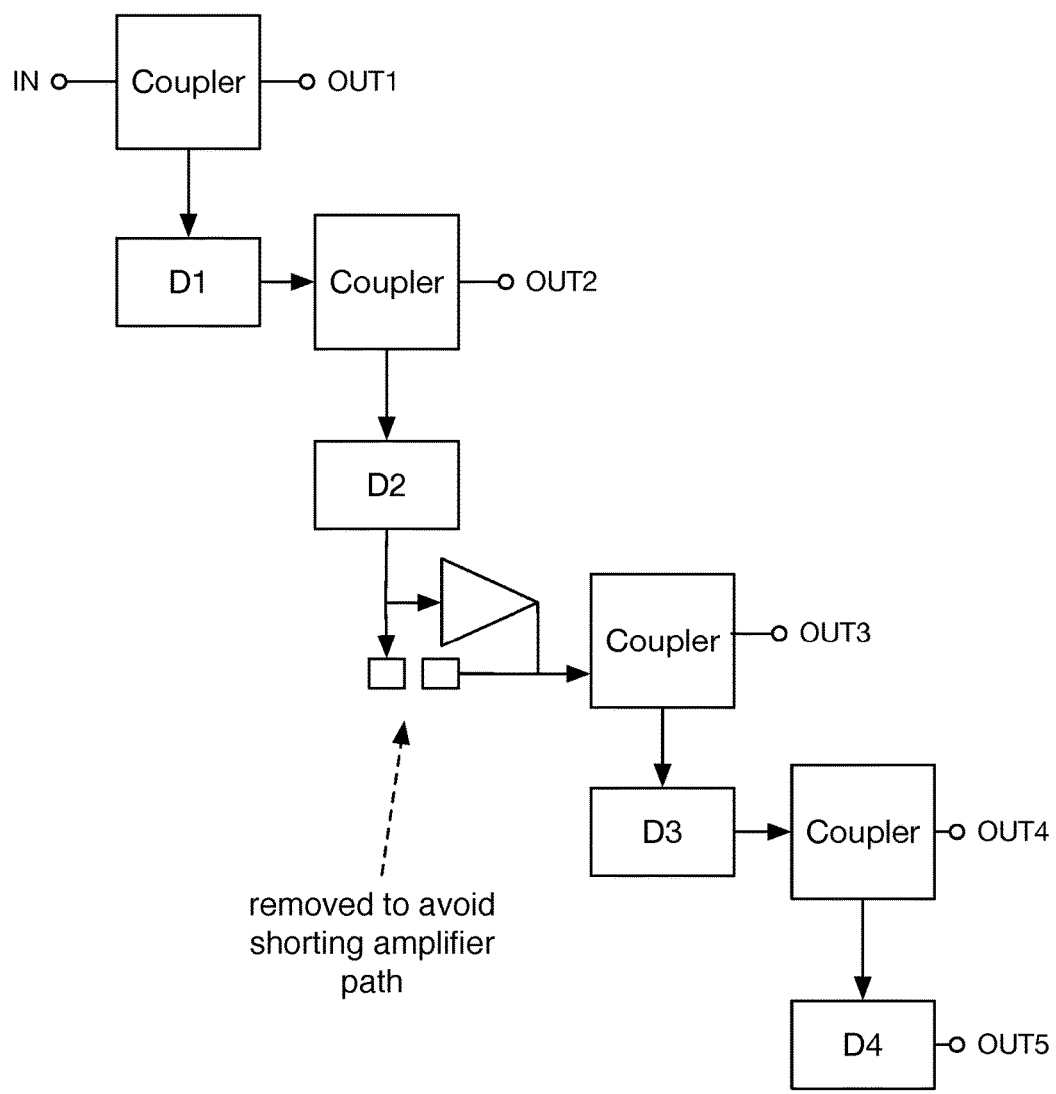
FIG. 12B is a schematic representation of a coupling block of a structure of a preferred embodiment.

As a third example, the coupling block 230 may include bridging links or contacts; that is, links between contacts of the coupling block 230 that may be bridged to modify the circuit architecture of the coupling block 230, as shown in FIGS. 11A and 11B. In this example, the coupling block 230 may include a set of closely spaced contacts that may be bridged (e.g., with a solder ball or other conductive deposition); alternatively or additionally, the coupling block 230 may include a bridge that may be selectively milled, etched, laser cut, etc. (as shown in FIGS. 12A and 12B). The coupling block 230 may additionally or alternatively include any set of electrical coupling points that may be modified by the addition or removal of conductive and/or isolative material.

The coupling block 230 may additionally or alternatively include circuit components desired to be inserted in the structure 200 signal path; for example, an amplifier as shown in FIGS. 12A and 12B. The coupling block 230 may include any suitable circuits or circuit components; e.g., transistors, capacitors, resistors, inductors, phase shift circuits, attenuators, amplifiers, etc.

As previously discussed, the structure 200 is preferably modular both intra-module (e.g., a modular delay may be constructed by selectively using outputs of a given structure 200) and inter-module (e.g., outputs of one structure 200 may be coupled to inputs of another structure 200, and so on, to create daisy-chained delays).

Note that while the structure 200 is described as a laminate structure, the structure 200 may additionally or alternatively be any multi-layer structure having delay blocks 210.

3. IDM Structure (IPD)

The IDM 100 may additionally or alternatively be implemented using an integrated passive device (IPD) process (or using another on-wafer fabrication process). In this embodiment, the IDM 100 is preferably implemented as part of an IPD structure 300 that comprises a set of delay blocks 310. The structure 300 functions as a particular implementation of the IDM 100, and thus is an analog time delay filter circuit.

Each block of the structure 300 preferably includes multiple layers; additionally or alternatively, the structure 300 may include single-layer blocks. Note that the term 'block' as used throughout this application refers to a three-dimensional volume containing at least one circuit element (e.g., an inductive, capacitive, and/or resistive element). A block may represent the entirety of one or more layers or any sub-area or sub-volume of those layers. While blocks are generally shown in the FIGUREs of this specification as rectangular prisms, it is understood that they may be of any shape.

The term 'block' is used due to the modular capability of the structure 300; blocks may be repeated (e.g., across a single layer or in different layers) to create such a modular structure. A 'repeated' block is a block with an identical modular layout to another block (i.e., external connections are accessible at the same points relative to a coordinate system defined by the boundaries of the block). Using an identical modular layout across layers may mean, for instance, that the same photolithographic mask can be used for more than one layer. As another example, modular chips may be assembled (e.g., by a manufacturing robot) and electrically coupled (e.g., via soldering). As a third example, blocks may include physical connectors (e.g., pins/sockets), allowing modular structures to be assembled manually. Note that while two blocks may have an identical layout, those blocks may or may not have identical electrical characteristics. For example, one block may have identical layout to another block, but use a different material for the dielectric between plates of a parallel plate capacitor (changing response).

Figure 13A:
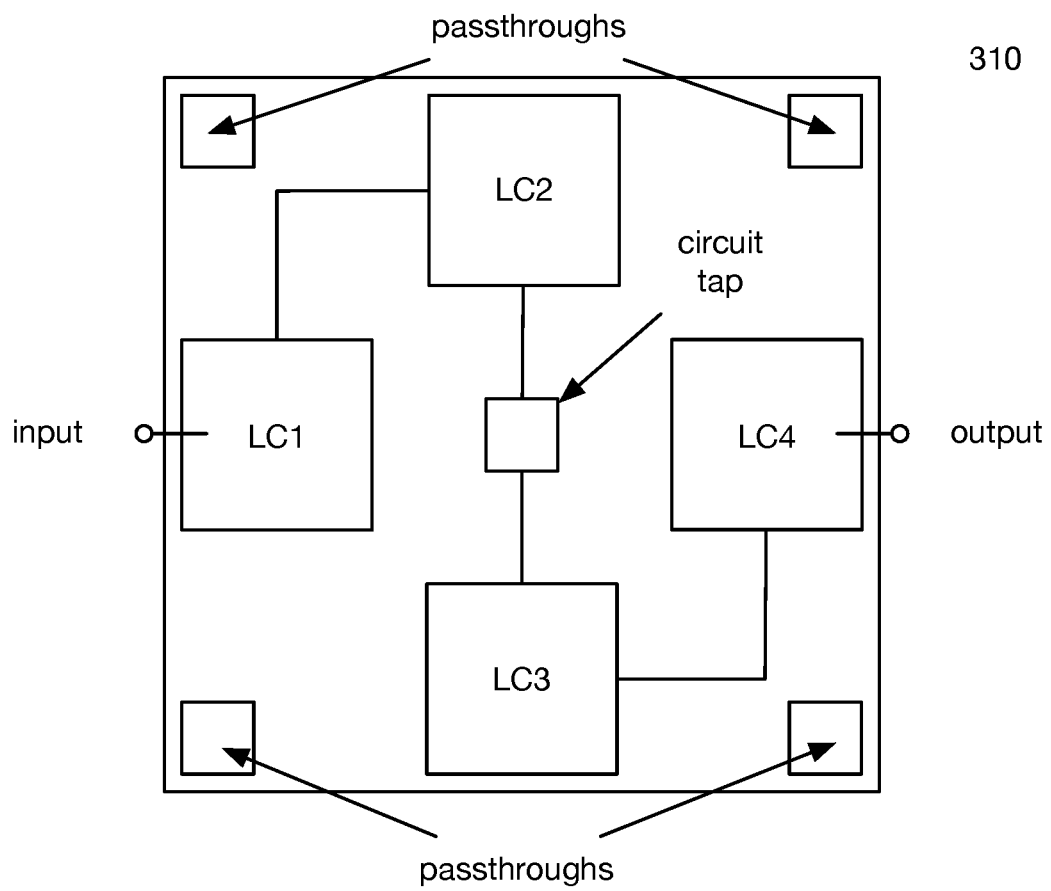
FIG. 13A is a schematic representation of a delay block of a structure of a preferred embodiment.

The delay block 310 includes one or more time delays, as shown in FIG. 13A (delays labeled as LC1, LC2 . . . ). The delay block 310 is preferably fabricated to include pass-throughs (e.g., connections on the bottom layer of the block that are passed through to the top layer of the block). While it is possible to layer delay blocks 310 in a similar manner to the structure 200, these passthroughs may additionally or alternatively used to pass signals/power from an underlying structure (e.g., an RF communications PCB) to a different chip atop the structure 300 (e.g., a CMOS chip or another IPD chip). Alternatively, the delay block 310 may include no such pass-throughs.

A pass-through is a connection that does not include any intentional reactive circuit elements (noting, of course, that any real-world physical connection has non-zero reactance). Such a pass-through preferably has substantially lower reactance (e.g., 10% or less) than an LC resonator used with said pass-through.

The time delays of the delay block 310 are preferably the LC resonator delay module 110, but may additionally or alternatively be any suitable time delay circuits.

Figure 13B:
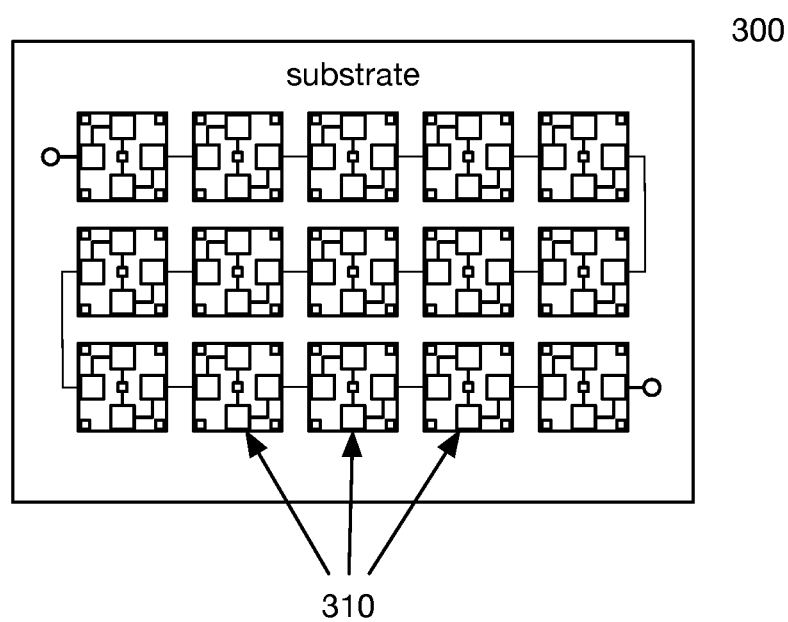
FIG. 13B is a schematic representation of a structure of a preferred embodiment.

The small size of the IPD structure may make it advantageous to array many blocks 310, for example as shown in FIG. 13B.

IPD structures 300 may be fabricated using any fabrication technology; for example, via masked etching and deposition on a silicon, alumina, or silica substrate. Likewise, IPD structures 300 may be packaged in any manner (e.g., wire bondable or flip-chip mountable).

The IPD structure 300 may additionally or alternatively include interposer blocks 320 (substantially similar to interposer blocks 220, but constructed using an IPD or similar process), but the function of the interposer blocks may alternatively be performed by a combination of the delay blocks 310 (which may include pass-throughs or taps; i.e., connection points to a circuit of a delay block 310) and an overlying chip. For example, a CMOS chip may be mounted to the IPD structure 300 using flip-chip assembly. By selectively placing solder balls or copper pillars, the CMOS chip can be selectively connected to the IPD structure 300 (or to underlying circuits via pass-throughs), as shown in FIGS. 14A and 14B.

Figure 14A:
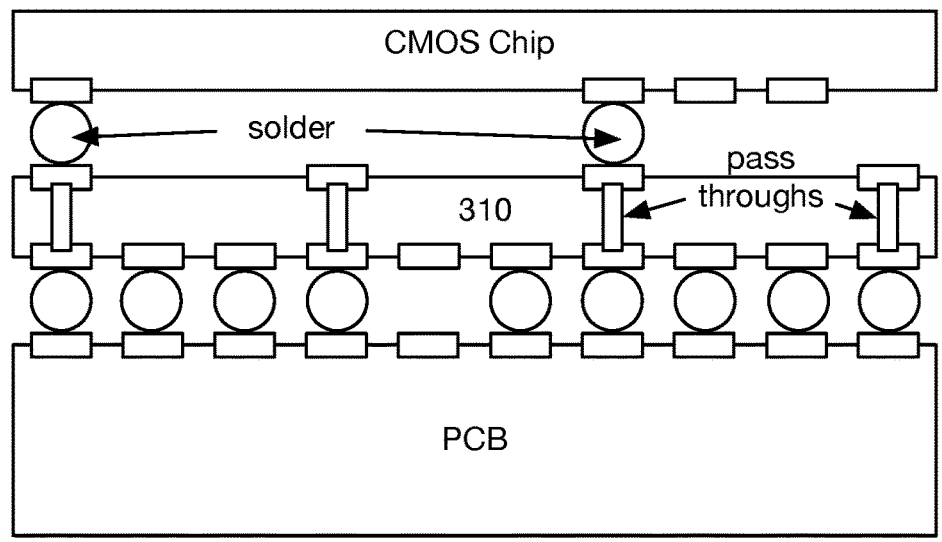
FIG. 14A is a layer representation of a structure of a preferred embodiment.
Figure 14B:
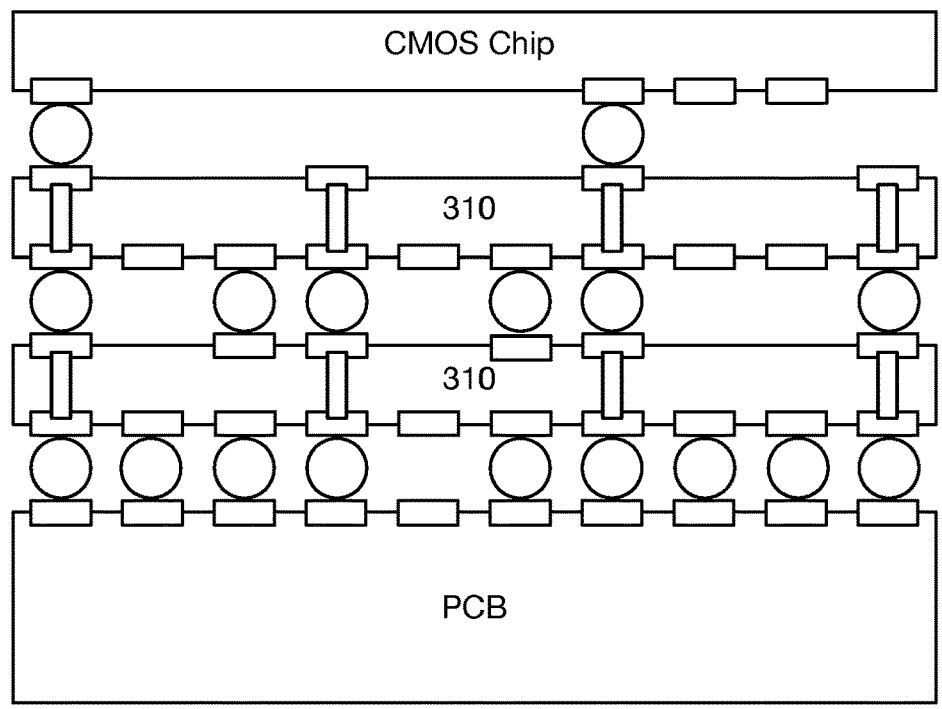
FIG. 14B is a layer representation of a structure of a preferred embodiment.

Note that in general, the circuitry connected to the active side of the IPD structure 300 (the active side is the side with the majority of circuitry; e.g., the side shown contacting the PCB in FIGS. 14A and 14B) may be referred to as a primary coupled circuit (e.g., in the case of FIGS. 14A and 14B, the primary coupled circuit is a PCB), which circuitry connected to the other side of the structure 300 (e.g., the CMOS chip in FIG. 14A, or another IPD structure) may be referred to as a secondary coupled circuit. The terms "primary coupled circuit" and "secondary coupled circuit" are not intended to have additional meaning besides as described here.

The structure 300 may comprise any number of switches, and switches (or a set of switches) may be any suitable components capable of selectively coupling the taps and/or coupling points of delays 310, or other components to circuit common rails, grounds, and/or circuit inputs/outputs. For example, switches may include mechanical switches, mechanical relays, solid-state relays, transistors, silicon controlled rectifiers, triacs, and/or digital switches. Switches of the set of switches may be operable electronically by a tuning circuit or other suitable controller, but may additionally or alternatively be set in any manner. For example, switches may be manually set by a circuit user. As another example, switches may be one-time-use junctions that are configured into a desired configuration when the delay 310 is manufactured (e.g., by soldering, annealing, fusing, cutting or any other suitable manner of irreversible configuration), resulting in a desired overall delay 310 configuration (e.g., group delay value).

Switches are preferably operable between one or more switch states, in which a state of the switch corresponds to coupling between two or more system components. For example, a switch (e.g., transistor) may be operable in a first switch state that couples a first tapping point to a coupling point of a resonator, and in a second switch state that couples a second tapping point to a coupling point of a resonator. In another example, a switch may be operable in a first switch state that couples one of a set of resonators to a common rail (e.g., a ground plane) of the system, in order to place it in the signal path of a signal passing through the time delay filter; this switch may be operable in a second switch state that decouples the resonator from the common rail, thereby removing the resonator from the signal path (and reducing the overall time delay applied by the time delay filter).

Similar to the structure 200, the structure 300 may include bridging links or contacts; e.g., such that may be bridged by solder balls used in the flip chip assembly process.

As previously discussed, the structure 300 is preferably modular both intra-module (e.g., a modular delay may be constructed by selectively using outputs of a given structure 300) and inter-module (e.g., outputs of one structure 300 may be coupled to inputs of another structure 300, and so on, to create daisy-chained delays).

Note that while the structure 300 is described as an IPD structure, the structure 300 may additionally or alternatively be any multi-layer structure having delay blocks 310.

The methods of the preferred embodiment and variations thereof can be embodied and/or implemented at least in part as a machine configured to receive a computer-readable medium storing computer-readable instructions. The instructions are preferably executed by computer-executable components preferably integrated with an analog time delay filter circuit. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

As a person skilled in the art will recognize from the previous detailed description and from the figures and claims, modifications and changes can be made to the preferred embodiments of the invention without departing from the scope of this invention defined in the following claims.

We claim:

1. An analog time delay filter circuit comprising:
a first delay circuit block, comprising:
a first time delay filter having at least one LC resonator;
a first input, electrically coupled to the first time delay filter;
a first output, electrically coupled to the first time delay filter;
a first circuit pass-through; and
a second circuit pass-through;
wherein the first output, the first input, the first circuit pass-through, and the second circuit pass-through intersect a first surface of the first delay circuit block according to a first modular layout; wherein the first delay circuit block further comprises a second surface;

a second delay circuit block, comprising:
  a second time delay filter having at least one LC resonator;
  a second input, electrically coupled to the second time delay filter;
  a second output, electrically coupled to the second time delay filter;
  a third circuit pass-through; and
  a fourth circuit pass-through;
 wherein the second output, the second input, the third circuit pass-through, and the fourth circuit pass-through intersect a third surface of the second delay circuit block according to a second modular layout; wherein the second delay circuit block further comprises a fourth surface; wherein the first and second modular layouts are identical; and
 a first substrate containing the first and second circuit delay blocks;
 wherein the first, second, third, and fourth circuit pass-throughs are coupled to a primary coupled circuit at a first active side of the first substrate and provide electrical connectivity to the primary coupled circuit at a first other side of the first substrate.

2. The analog time delay filter circuit of claim 1, wherein the first, second, third, and fourth surfaces are planar and parallel; wherein the first surface is intersected by the first input, the first output, and the first and second pass-throughs; wherein the second surface is also intersected by the first and second pass-throughs; wherein the third surface is intersected by the second input, the second output, and the third and fourth pass-throughs; wherein the fourth surface is also intersected by the third and fourth pass-throughs.

3. The analog time delay filter circuit of claim 1, wherein the first delay circuit block and second delay circuit block are, with other delay circuit blocks, rectangularly arrayed on the first active side of the first substrate.

4. The analog time delay filter circuit of claim 3, wherein the analog time delay filter circuit is fabricated by an integrated passive device (IPD) process.

5. The analog time delay filter circuit of claim 4, wherein the analog time delay filter circuit is packaged in wire bondable packaging.

6. The analog time delay filter circuit of claim 4, wherein the analog time delay filter circuit is packaged in flip-chip mountable packaging.

7. The analog time delay filter circuit of claim 6, wherein electrical connections of the analog time delay filter circuit are configured by selectively placing solder balls or other electrical connectors during the flip-chip mounting process.

8. The analog time delay filter circuit of claim 7, wherein the first delay circuit block contains a bridgeable contact; wherein the bridgeable contact may be bridged by selectively placing solder balls or other electrical connectors during the flip-chip mounting process; wherein bridging the bridgeable contact during the flip-chip mounting process modifies a time delay produced by the first delay circuit block.

9. The analog time delay filter circuit of claim 8, wherein the first delay circuit block has a first LC resonator and a second LC resonator; wherein the first delay circuit block further comprises a tap connection coupled between the first LC resonator and the second LC resonator; wherein the first delay circuit block is configured by selectively coupling the tap connection to the primary coupled circuit using solder balls or other electrical connectors during the flip-chip mounting process.

10. The analog time delay filter circuit of claim 9, wherein the analog time delay filter circuit is additionally coupled to a secondary coupled circuit at the first other side of the first substrate; wherein the secondary coupled circuit is electrically coupled to the primary coupled circuit via at least one of the first, second, third, and fourth circuit pass-throughs.

11. The analog time delay filter circuit of claim 6, further comprising:
  a third delay circuit block, comprising:
   a third time delay filter having at least one LC resonator;
   a third input, electrically coupled to the third time delay filter;
   a third output, electrically coupled to the third time delay filter;
   a fifth circuit pass-through; and
   a sixth circuit pass-through;
  wherein the third output, the third input, fifth first circuit pass-through, and the sixth circuit pass-through intersect a fifth surface of the third delay circuit block according to a third modular layout;
  a fourth delay circuit block, comprising:
   a fourth time delay filter having at least one LC resonator;
   a fourth input, electrically coupled to the fourth time delay filter;
   a fourth output, electrically coupled to the fourth time delay filter;
   a seventh circuit pass-through; and
   an eighth circuit pass-through;
  wherein the fourth output, the fourth input, the seventh circuit pass-through, and the eighth circuit pass-through intersect a seventh surface of the fourth delay circuit block according to a fourth modular layout; wherein the third and fourth modular layouts are identical; and
  a second substrate containing the third and fourth circuit delay blocks;
  wherein the fifth, sixth, seventh, and eighth circuit pass-throughs are coupled to the first other side of the first substrate at a second active side of the second substrate and provide electrical connectivity to the first substrate at a second other side of the second substrate.

12. The analog time delay filter circuit of claim 11, wherein the first and second modular layouts are distinct from the third and fourth modular layouts.

13. The analog time delay filter circuit of claim 11, wherein the first, second, third, and fourth modular layouts are identical.

14. The analog time delay filter circuit of claim 13, wherein the first and fifth circuit pass-throughs are electrically coupled and provide electrical connectivity to the primary coupled circuit at the second other side of the second substrate.

15. The analog time delay filter circuit of claim 14, wherein electrical connections of the analog time delay filter circuit are configured by selectively placing solder balls or other electrical connectors during the flip-chip mounting process.

16. The analog time delay filter circuit of claim 15, wherein the second circuit pass-through is selectively couplable to the sixth circuit pass-through by placing solder balls or other electrical connectors during the flip-chip mounting process.

17. The analog time delay filter circuit of claim 16, wherein the analog time delay filter circuit is additionally coupled to a secondary coupled circuit at the second other side of the second substrate; wherein the secondary coupled circuit is electrically coupled to the primary coupled circuit via at least two of the first, second, third, and fourth, fifth, sixth, seventh, and eighth circuit pass-throughs.

18. The analog time delay filter circuit of claim 17, wherein the first delay circuit block contains a bridgeable contact; wherein the bridgeable contact may be bridged by selectively placing solder balls or other electrical connectors during the flip-chip mounting process; wherein bridging the bridgeable contact during the flip-chip mounting process modifies a time delay produced by the first delay circuit block.

* * * * *